(12) United States Patent
Mikubo et al.

(10) Patent No.: US 7,483,261 B2
(45) Date of Patent: Jan. 27, 2009

(54) COOLING DEVICE FOR AN ELECTRONIC EQUIPMENT

(75) Inventors: Kazuyuki Mikubo, Tokyo (JP); Sakae Kitajo, Tokyo (JP); Atsushi Ochi, Tokyo (JP); Mitsuru Yamamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/561,980

(22) PCT Filed: Jun. 25, 2004

(86) PCT No.: PCT/JP2004/008979

§ 371 (c)(1),
(2), (4) Date: Dec. 22, 2005

(87) PCT Pub. No.: WO2005/002307

PCT Pub. Date: Jan. 6, 2005

(65) Prior Publication Data

US 2006/0139882 A1 Jun. 29, 2006

(30) Foreign Application Priority Data

Jun. 27, 2003 (JP) ............................. 2003-184368

(51) Int. Cl.
*H05K 7/20* (2006.01)
(52) U.S. Cl. .................................................. 361/669
(58) Field of Classification Search ................. 361/699, 361/695–698, 687–692, 701–703
See application file for complete search history.

(56) References Cited

U.S. PATENT DOCUMENTS

| | | | |
|---|---|---|---|
| 3,543,394 A * | 12/1970 | Matlow ...................... | 438/353 |
| 6,611,425 B2 | 8/2003 | Ohashi et al. | |
| 6,757,169 B2 | 6/2004 | Kondo et al. | |
| 6,865,077 B2 | 3/2005 | Igarashi | |
| 6,885,556 B2 | 4/2005 | Kondo et al. | |
| 6,955,212 B1 * | 10/2005 | Hsieh ........................ | 165/80.4 |
| 7,069,737 B2 * | 7/2006 | Wang et al. ................. | 62/259.2 |
| 7,113,404 B2 * | 9/2006 | Naganawa et al. .......... | 361/699 |
| 7,149,084 B2 * | 12/2006 | Matsushima et al. ........ | 361/699 |
| 2002/0105781 A1 | 8/2002 | Ohashi et al. | |
| 2005/0180108 A1 | 8/2005 | Kondo et al. | |

FOREIGN PATENT DOCUMENTS

| | | | |
|---|---|---|---|
| JP | 2002-009477 A | 1/2002 | |
| JP | 2002-094277 A | 3/2002 | |
| JP | 2002-094277 A | 3/2002 | |
| JP | 2002-232174 A | 8/2002 | |
| JP | 2003-067087 A | 3/2003 | |
| JP | 2003-078271 A | 3/2003 | |
| JP | 2003-078271 A | 3/2003 | |

* cited by examiner

*Primary Examiner*—Jean F Duverne
(74) *Attorney, Agent, or Firm*—Foley & Lardner LLP

(57) ABSTRACT

A cooling device includes a cooling panel wherein a passage is formed by bonding together a bottom heat radiation plate having a groove formed therein and a top heat radiation plate, and a circulation pump circulating refrigerant within the passage. The top heat radiation plate is provided with an outlet port through which the refrigerant flows out from the passage to the circulation pump and an inlet port through which the refrigerant flows in from the circulation pump to the passage. The circulation pump is fixed onto the top heat radiation plate of the cooling panel so that the suction port and discharge port are aligned with the outlet port and inlet port, respectively.

17 Claims, 27 Drawing Sheets

(b)

(a)

(a)

(b)

(a)

(b)

(a)

(b)

(a)

(b)

(a)

(b)

(c)

(a)

(b)

(a)

(b)

(a)

(b)

(a)

(b)

(c)

(a)

(b)

(c)

COOLING DEVICE FOR AN ELECTRONIC EQUIPMENT

TECHNICAL FIELD

The present invention relates to a cooling device for an electronic equipment and, more particularly, to a cooling device for an electronic equipment, suitable to cooling a heating part, such as a CPU, mounted on a notebook personal computer.

BACKGROUND ART

Along with the increase in the amount and speed of processing, heating parts having a larger power dissipation, such as a CPU, are installed in the recent electronic equipment, such as a personal computer, and the amount of heat generated by the heating parts is more and more increasing. In these electronic equipment, the variety of electronic parts used therein generally have an operating temperature limit due to the temperature dependency of the heat-resistance reliability and operating characteristic. Thus, it is an urgent subject to establish the technique for efficient radiation of the heat generated within the electronic equipment toward the outside thereof.

In general, the electronic equipment, such as a personal computer, includes a metal heat sink or so-called heat pipe etc. attached to the CPU etc. as a heat absorbing part, which diffuses the heat across the entirety of the electronic equipment by heat conduction, or an electromagnetic cooling fan attached onto the housing for radiating the heat from inside to outside of the electronic equipment.

For example, an electronic equipment, such as a notebook personal computer, on which electronic parts are densely mounted, has a small heat radiation space within the electronic equipment, and is capable of cooling a CPU having a power consumption of up to 300 watts by using a conventional cooling fan alone or a combination of the cooling fan and heat pipe. It is difficult, however, to sufficiently radiate the internal heat from a CPU having a power consumption above that value.

Even if the heat radiation is possible, it is essential to install a large blowing-capacity cooling fan, and if an electromagnetic cooling fan is used therefor in particular, silence is lost due to the noise such as a hissing sound by the rotary blades. In a personal computer used as a server, request for a smaller size and the silence is increasing along with the spreading use thereof, and accordingly, there occurs a problem in the heat radiation therefrom similarly to the notebook personal computer.

For efficient radiation of the increased amount of heat, use of a liquid-type cooling device which circulates refrigerant therethrough is studied. For example, JP-A-2003-67087 describes a liquid-type cooling device, wherein a personal computer body is provided with a heat-receiving head which receives heat from the heating parts of the personal computer body. A housing is also disposed which is provided with a connecting head, to which the heat from the heating parts is transferred through the heat-receiving head, a tube connected to the connecting head and filled with refrigerant, and a pump for circulating the refrigerant, which are disposed on the bottom of the personal computer body.

DISCLOSURE OF THE INVENTION

Problems to Be Solved By the Invention

The conventional technique described in the above publication has the configuration wherein the refrigerant is circulated through the tube disposed on the bottom of the personal computer body, an thus a sufficient heat radiation area cannot be secured therein. Accordingly, there is a problem in that it only achieves a lower cooling efficient and it is difficult to achieve a smaller thickness for the cooling device.

In addition, the refrigerant is likely to leak from the connection between the pump and the tube in the conventional technique, and there is a higher possibility that the leakage of the refrigerant damages the electronic parts mounted on the electronic equipment, to thereby degrade the reliability thereof.

Further, during the circulation of the refrigerant through the passage having a closed structure, a temperature change within the electronic equipment or a pressure change in the passage may collect the oxygen etc. included in the liquid to form air bubbles therein. If the air bubbles enter the pump chamber due to the liquid circulation, there arises a problem in that the presence of the air bubbles incurs absorption of pressure, reduces the pressure transmitted from the pump, and thus reduces the rate of liquid flow. Furthermore, there is another problem in that a pressure change occurs in the electronic equipment to thereby destroy the structure itself of the liquid circulation device due to a stress generated at a local position.

The present invention is devised in view of the above problems, and it is an object of the present invention to provide a cooling device for an electronic equipment, which is capable of assuring a sufficient heat radiation area to improve the cooling efficiency and capable of being reduced in the thickness thereof.

It is also an object of the present invention to provide a cooling device for an electronic equipment, which is capable of solving the problem caused by bubbling of the refrigerant to assure a stable cooling performance and a higher reliability thereof.

Means for Solving the Problems

The present invention provides, in a first aspect thereof, a cooling device for an electronic equipment, including: a cooling panel including a bottom heat radiation plate and a top heat radiation plate, at least one of which is provided with a groove, the bottom heat radiation plate and top heat radiation plate being bonded together to form a passage of refrigerant; and a circulation pump fixed onto the cooling panel to circulate the refrigerant through the passage for radiating heat transferred to the cooling panel.

The present invention also provides, in a second aspect thereof, a cooling device for an electronic equipment, including a substrate, a passage embedded in the substrate and passing therethrough refrigerant, a circulation pump disposed on a surface of the substrate, and a reservoir communicated with the passage via a branch hole, wherein the circulation pump circulates the refrigerant through the passage to radiate heat transferred to the substrate.

Effects of the Invention

With the cooling device for an electronic equipment according to the first aspect of the present invention, the configuration wherein the passage for the refrigerant is formed within the cooling panel provides a larger cooling area and a higher cooling efficiency while using a cooling device having a compact-shaped cooling panel.

With the cooling device for an electronic equipment according to the second aspect of the present invention, the configuration wherein the cooling device includes the reservoir communicated with the passage prevents the refrigerant from bubbling to thereby assure the reliability of the cooling device and a stable cooling performance.

It is preferable in the cooling device of the present invention that the circulation pump be a piezoelectric pump. A further compact structure can be obtained for the cooling device.

It is also a preferable embodiment of the present invention that the piezoelectric pump includes a pump housing defining a pump chamber receiving therein a piezoelectric vibration plate, and the pump housing is fixed onto the cooling panel so that a discharge port and a suction port are aligned with the inlet port and the outlet port, respectively.

The present invention may have a configuration wherein the piezoelectric vibration plate has a bimorph structure including an elastic circular plate and a pair of piezoelectric ceramic circular plates sandwiching therebetween the elastic circular plate and polarized in opposite directions to each another, each of the pair of piezoelectric ceramic circular plates has a layered structure including a plurality of ceramic layers, and adjacent two of the ceramic layers in the layered structure are polarized in opposite directions to each other.

In an alternative of the above, the present invention may have a configuration wherein the piezoelectric vibration plate includes a pair of first piezoelectric ceramic elements not polarized, a pair of second piezoelectric ceramic elements sandwiching therebetween the first piezoelectric ceramic elements and polarized in opposite directions to each other, and a pair of third piezoelectric ceramic elements disposed outside the second piezoelectric ceramic elements and not polarized, and wherein each of the second piezoelectric ceramic elements has a layered structure including a plurality of ceramic layers, adjacent two of the ceramic layers in the layered structure are polarized in opposite direction to each other, and the first through third piezoelectric ceramic elements are sintered to form an integral structure.

It is also preferable that a check valve be provided in operative relationship with each of the discharge port and the suction port, and the check valve be fixed onto a member which is detachably attached onto the pump housing. It is preferable that a strut (reinforcement) for reinforcing bonding of the bottom heat radiation plate and the top heat radiation plate be formed in the groove. It is also a preferable embodiment of the present invention to further include a reservoir fixed onto the top heat radiation plate of the cooling panel and communicated with a branch hole formed in the passage. It is also preferable that a taper portion of a circular truncated cone or truncated pyramid having an apex at an exit of the branch hole is formed on a bottom surface of the reservoir.

It is preferable that the volume of the reservoir below the apex of the taper portion be larger than the volume of the reservoir above the apex of the taper portion, and the refrigerant be filled in the reservoir so that the liquid level of the refrigerant is above the apex of the taper portion.

It is also preferable that a protrusion having an area smaller than a cross-sectional area of the branch hole be formed on top of the reservoir at a position opposing the branch hole.

It is also preferable that a portion of the passage be replaced by a micro-channel structure including a plurality of grooves having a width smaller than a width of the above groove.

It is also preferable that a guide plate be formed between the passage and the micro-channel structure for enlarging flow of the refrigerant from a width of the passage up to a width of the micro-channel structure.

It is also preferable that the guide plate include a plurality of guide plates, and that one of the guide plates be longer than another of the guide plates located at downstream of the one of the guide plates, and have a larger angle with respect to a flow direction of the refrigerant than the another. It is preferable that the passage be coated with metal.

In the cooling device according to the second aspect of the present invention, the reservoir may be a laid-down-type reservoir fixed onto the surface of the substrate or may be a standing-rest-type reservoir embedded within the substrate.

In the cooling device according to the second aspect of the present invention, a standing-rest-type reservoir, if provided, traps without fail the air bubbles generated and circulated together with the refrigerant within the passage in the liquid-cooling mechanism, and alleviates a pressure fluctuation within the passage corresponding to the expansion or compression of the refrigerant caused by a temperature fluctuation thereof, even if the electronic equipment body, such as a notebook personal computer, is used on a desk in a laid-down state or is used hanging on a wall etc. A laid-down-type reservoir, if provided, traps without fail the air bubbles generated and circulated together with the refrigerant within the passage in the liquid-cooling mechanism and alleviates a pressure fluctuation within the passage corresponding to the expansion or compression of the refrigerant caused by a temperature fluctuation thereof, if the electronic equipment is used on a desk in a laid-down state. Accordingly, it is preferable to provide both the reservoirs.

The present invention also provides an electronic equipment mounting thereon above the cooling device for electronic equipment.

BEST MODES FOR CARRYING OUT THE INVENTION

Figure 1:
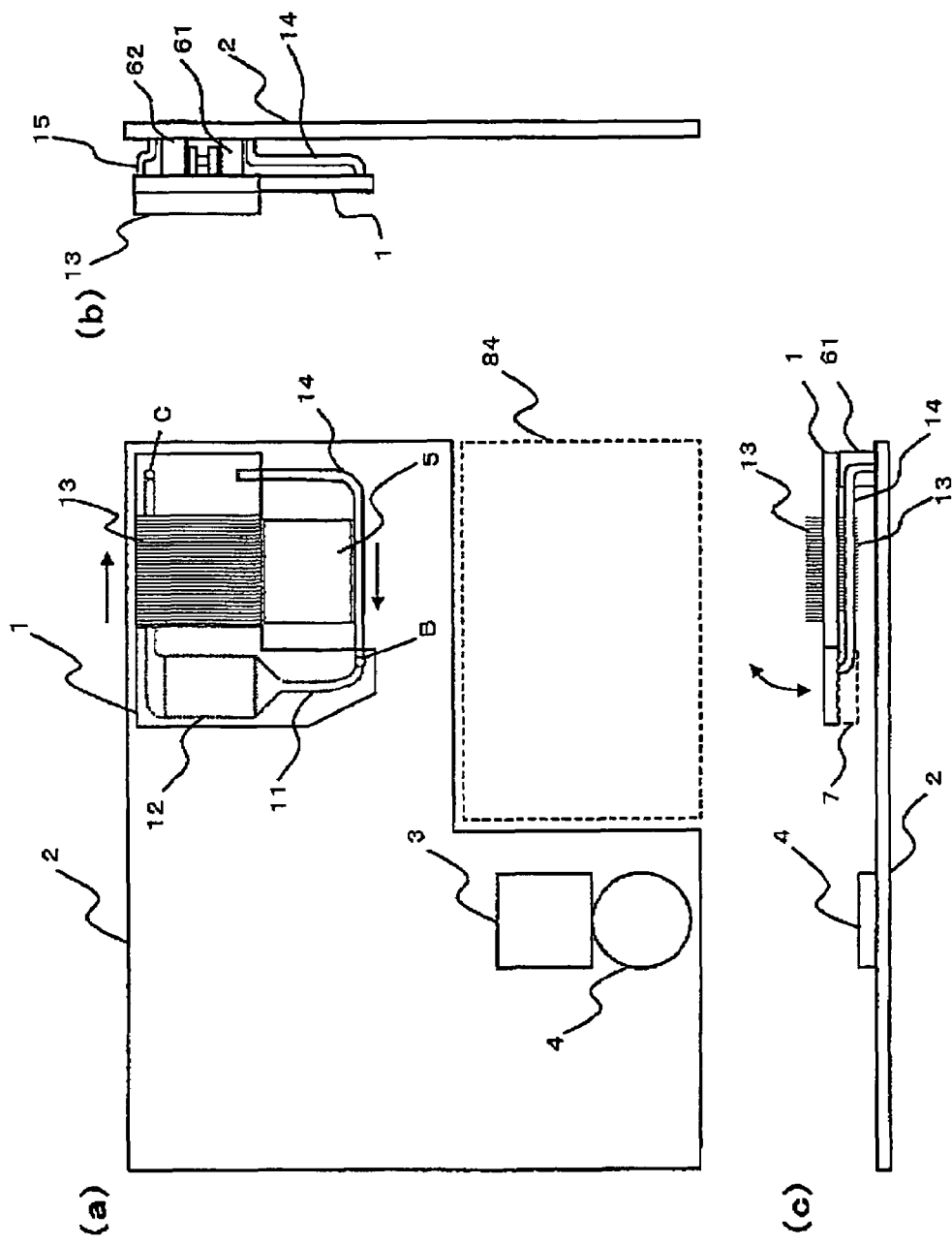
FIG. 1(a) is a top plan view of a cooling device for an electronic equipment according to a first embodiment of the present invention, and (b) and (c) are a side view and a front view, respectively, thereof.

Now, the present invention will be described in more detail based on the embodiments of the present invention with reference to the drawings. Similar constituent elements are designated by similar reference numerals throughout the drawings.

Referring to FIG. 1, a cooling device for an electronic equipment according to a first embodiment includes a first cooling panel 1, a second cooling panel 2, and coupling members 61, 62, which couple together the first cooling panel 1 and second cooling panel 2, and bear the first cooling panel 1 for allowing closing and opening movement thereof with respect to the second cooling panel 2 in the direction of arrows shown in FIG. 1(c). The present invention is applied to the second cooling panel 2.

The cooling device has a function of cooling the heating parts 7, such as CPU or other heating bodies generating heat, by circulating refrigerant such as water and antifreeze liquid through the passage, which is formed in the first cooling panel 1 and second cooling panel 2. The numeral 84 shown in FIG. 1 denotes a battery, and the second cooling panel 2 in the cooling device for the electronic equipment has a shape that does not overlap the area for the battery 84. The shape of the first cooling panel 1 and second cooling panel 2 shown in FIG. 1 is suitably determined based on a variety of constraints, upon mounting the same on an electronic equipment.

Figure 2:
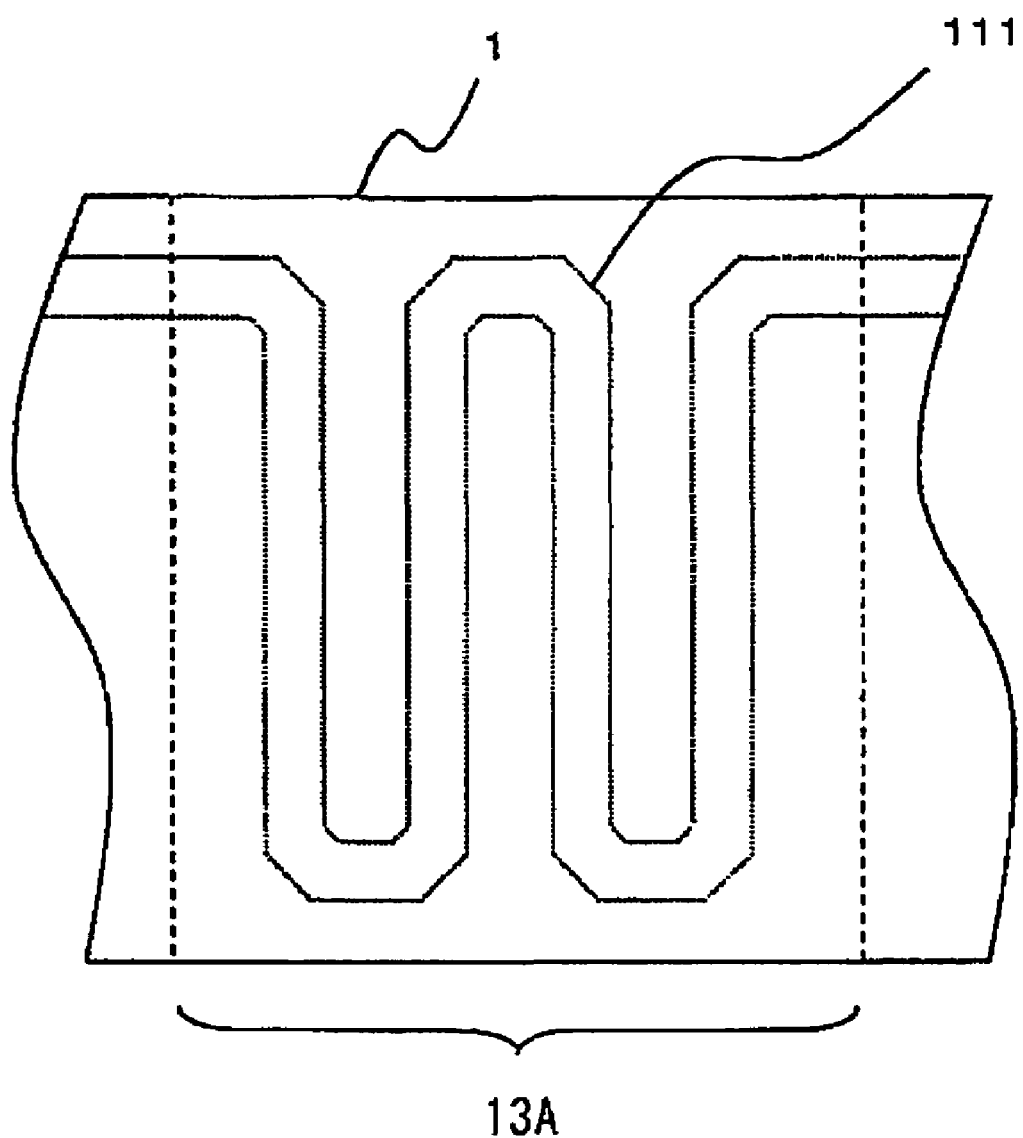
FIG. 2 A top plan view showing the configuration of the passage underlying the air-cooled fin shown in FIG. 1.

A metallic material, such as copper (Cu) and aluminum (Al), having a superior heat conductivity is used for the first cooling panel 1, in which the passage 11 and a micro-channel structure 12 are formed, as shown in FIG. 1. The top and bottom surfaces of the first cooling panel 1 are provided with respective air-cooled fins 13, and the passage 11 within the area 13A, in which the air-cooled fins 13 are formed, is configured as a wobbled passage 111 for improving the cooling effect, as shown in FIG. 2. The numeral 5 shown in FIG. 1(a) denotes a cooling fan 5, which forms an air-flow in the air-cooled fin provided on the first cooling panel 1, for improvement of air-cooling effect.

Figure 3:
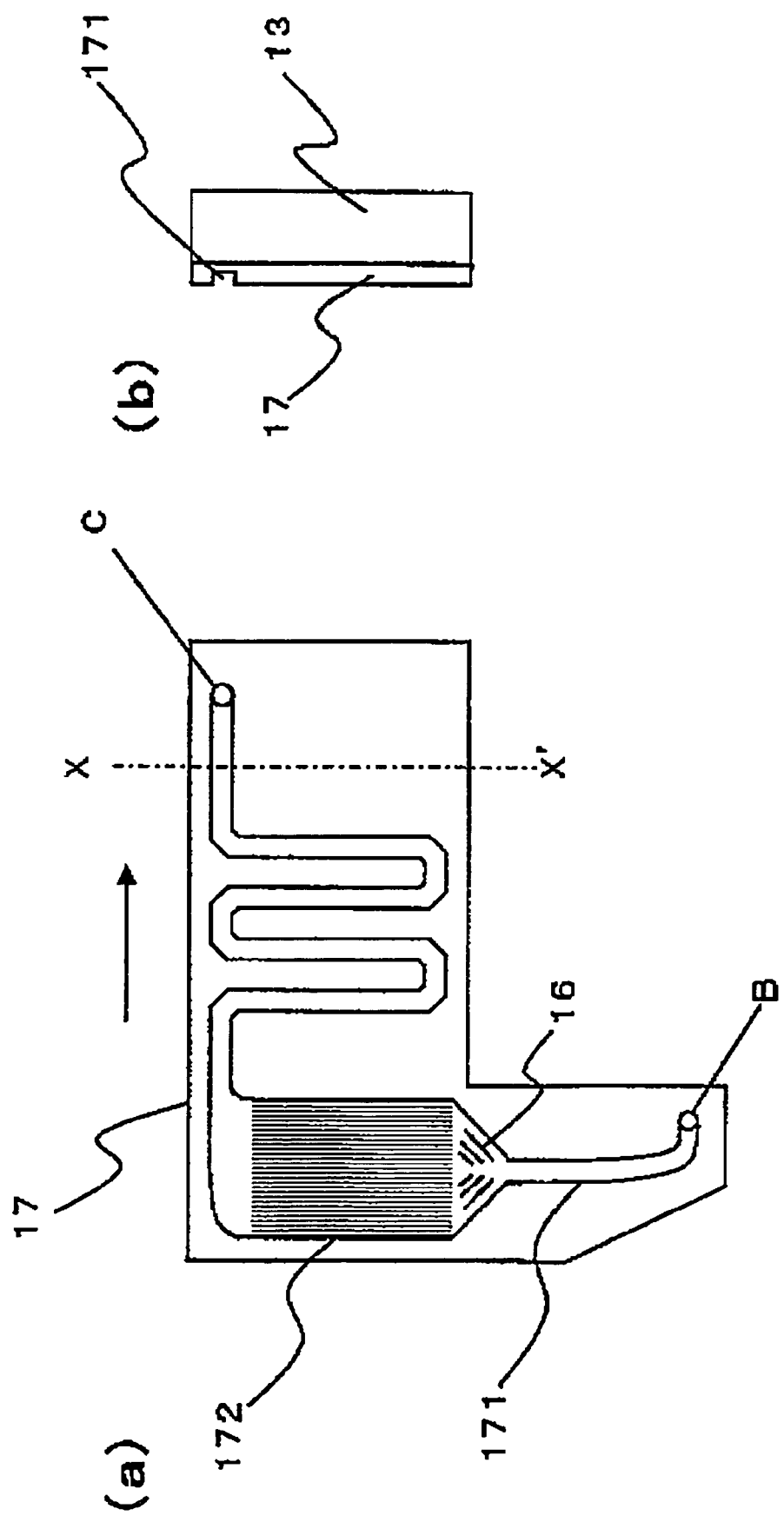
FIG. 3(a) is top plan view of the bottom heat radiation plate of the first cooling panel configuring the first cooling panel member shown in FIG. 1, and (b) is a side view thereof.
Figure 4:
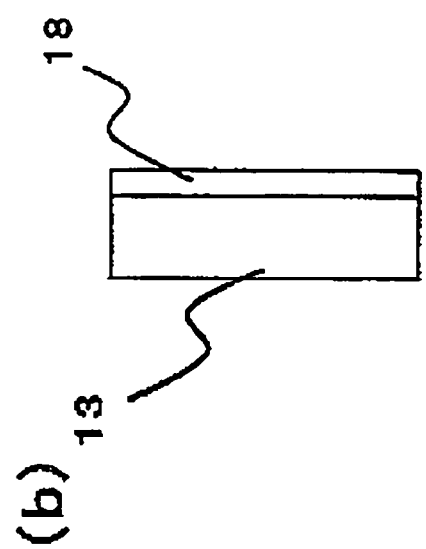
FIG. 4(a) is a top plan view of the top heat radiation plate of the first cooling panel configuring the first cooling panel member shown in FIG. 1, and (b) is a side view thereof.
Figure 4:
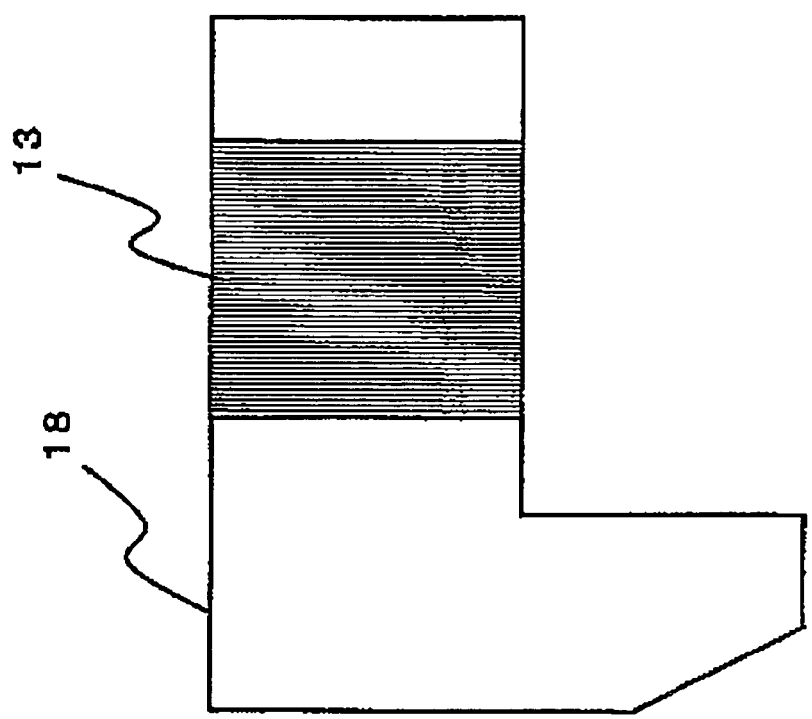

The first cooling panel 1 is manufactured by bonding the bottom heat radiation plate 17 and the top heat radiation plate 18 shown in FIGS. 3 and 4, respectively, by using a bonding technique such as diffusion bonding, braze bonding or laser bonding. The groove 171 and the narrow grooves 172 in the micro-channel structure 12, which are formed on the bottom heat radiation plate 17 of the first cooling panel, are covered by the top heat radiation plate 18 of the first cooling panel, thereby forming the passage 11 and the micro-channel structure 12. The formation of the groove 11 and the narrow grooves 172 of the micro-channel structure on the bottom heat radiation plate 17 of the first cooling panel may be performed by pressing to form these grooves, by molding in the state of having the grooves, or by grinding.

In the bottom heat radiation plate 17 of the first cooling panel are formed an opening B configuring an inlet port through which the refrigerant flows into the passage 11, and an opening C configuring an outlet port through which the refrigerant flows out of the passage 11. The opening B and opening C are coupled to metallic tube 14 and metallic tube 15, respectively. Flexible metallic tubes are used for the metallic tubes 14, 15, to thereby incur no obstacle against the closing and opening movement of the first cooling panel 1 with respect to the second cooling panel 2.

The area in which the micro-channel structure 12 is formed on the bottom surface of the bottom heat radiation plate 17 of the first cooling panel contacts the top surface of the heating parts 7 such as CPU and other heating bodies which have a large power dissipation and generate heat locally in a small area. The heat generated by the heating parts 7 is transferred to the refrigerant flowing within the micro-channel structure 12 via the bottom heat radiation plate 17 of the first cooling panel. The micro-channel structure 12 includes a plurality of narrow-width channels having a width of 1 mm or smaller, which is smaller than the width of the passage 11 formed in the first cooling panel 1. The micro-channel structure 12 is formed in the area in which the bottom heat radiation plate 17 of the first cooling panel contacts the heating parts 7, and has a dimension larger than this area. In the first embodiment, the passage 11 formed in the first cooling panel 1 was 6 mm wide and 1.5 mm deep, and 38 channels having a width of 0.5 mm and a depth of 1.5 mm were formed in the micro-channel structure 12.

Figure 5:
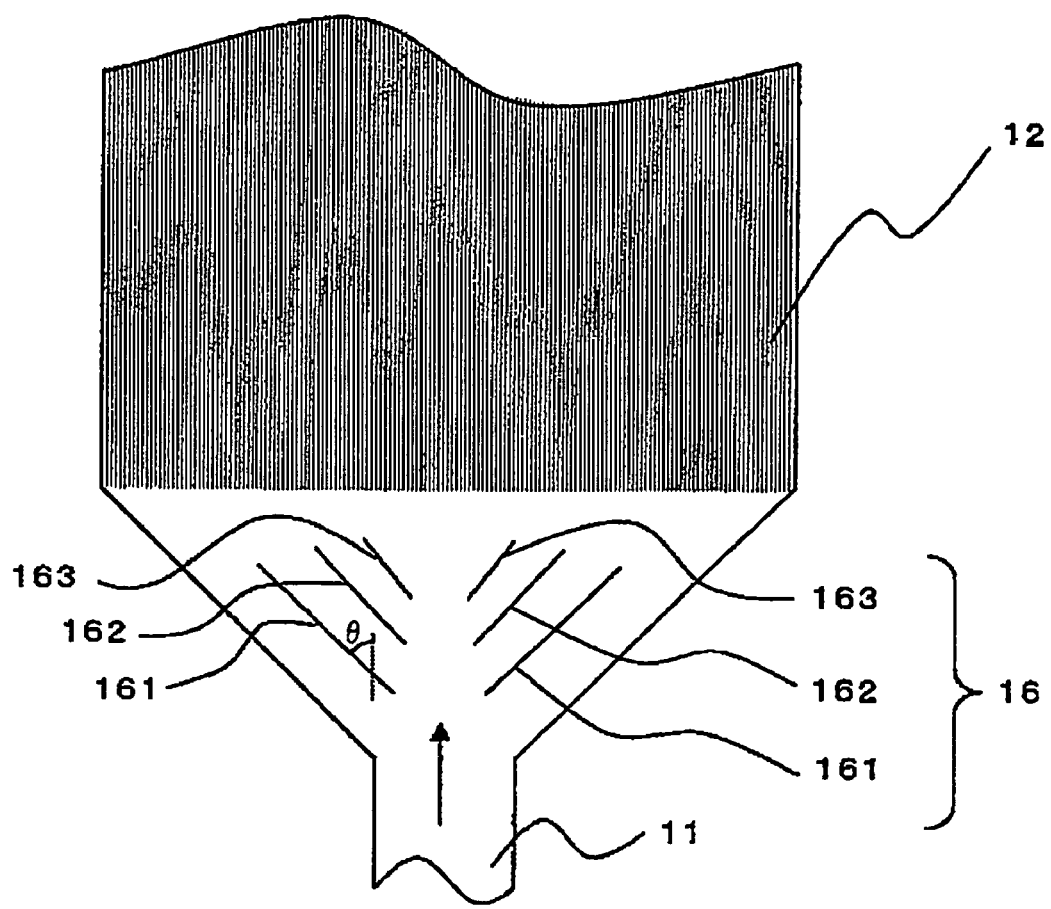
FIG. 5 A top plan view showing the configuration of the introduction portion for the micro-channel structure shown in FIG. 1.

The inlet through which the refrigerant flows into the micro-channel structure 12 is such that the width of the passage 11 is gradually widened toward the micro-channel structure 12 to be equal to the width of the micro-channel structure 12 at the end thereof, as shown in FIG. 5. The inlet of the micro-channel structure is provided with guide plates 16 for diffusing the refrigerant flowing from the passage 11 to flow in the width of the micro-channel structure 12. The guide plates 16 includes first guides plates 161, second guide plates 162 and third guide plates 163, which are arranged consecutively from the upstream of the refrigerant and each forms a pair located on left and right sides. The relationship between the lengths of the guide plates is such that a guide plate located at the upstream side is longer than another, i.e., the first guide plates 161 are longer than the second guide plates 162, which are longer than the third guide plates 163. The relationship between angles θ of guide plates, shown in FIG. 5, with respect to the flow direction of the refrigerant is such that the angle of a guide plate located at the upstream side is larger than the angle of another, i.e., angle of the first guide plates 161 is larger than the angle of the second guide plates 162, which is larger than the angle of the third guide plates 163.

Figure 6:
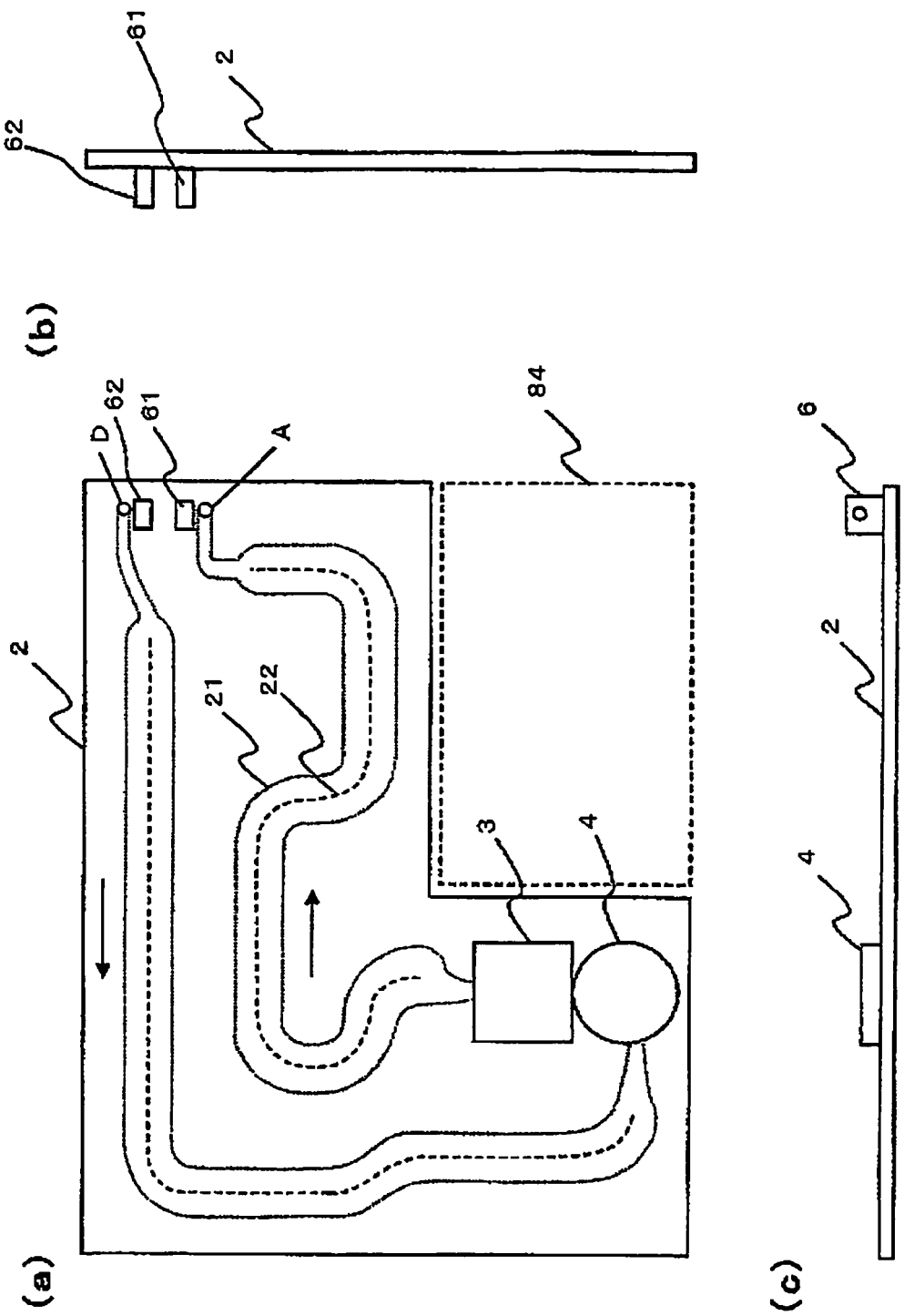
FIG. 6(a) is a top plan view of the second cooling panel shown in FIG. 1, and (b) and (c) are a side view and a front view, respectively, thereof.

As for the second cooling panel 2, which is shown as an example for the cooling device of the present invention, a metallic material, such as copper (Cu) and aluminum (Al), having a superior heat conductivity is used therefor, and as shown in FIG. 6, it is provided with a passage 21 therein, and provided with a circulation pump 3 and a reservoir 4 attached on the top surface thereof.

Figure 7:
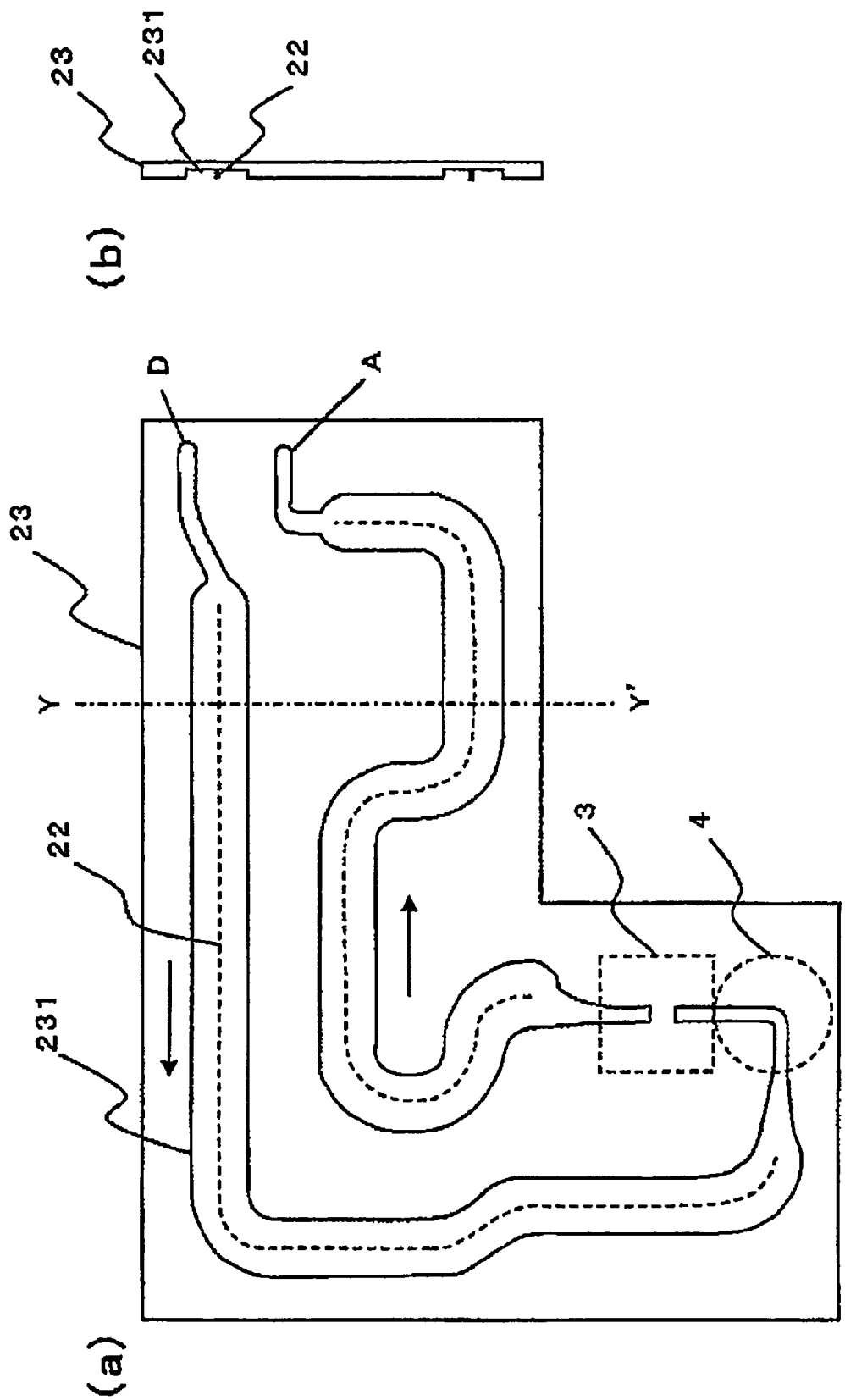
FIG. 7(a) is a top plan view of the bottom heat radiation plate of the second cooling panel configuring the second cooling panel member shown in FIG. 6, and (b) is a sectional view taken along line Y-Y' shown in (a).
Figure 8:
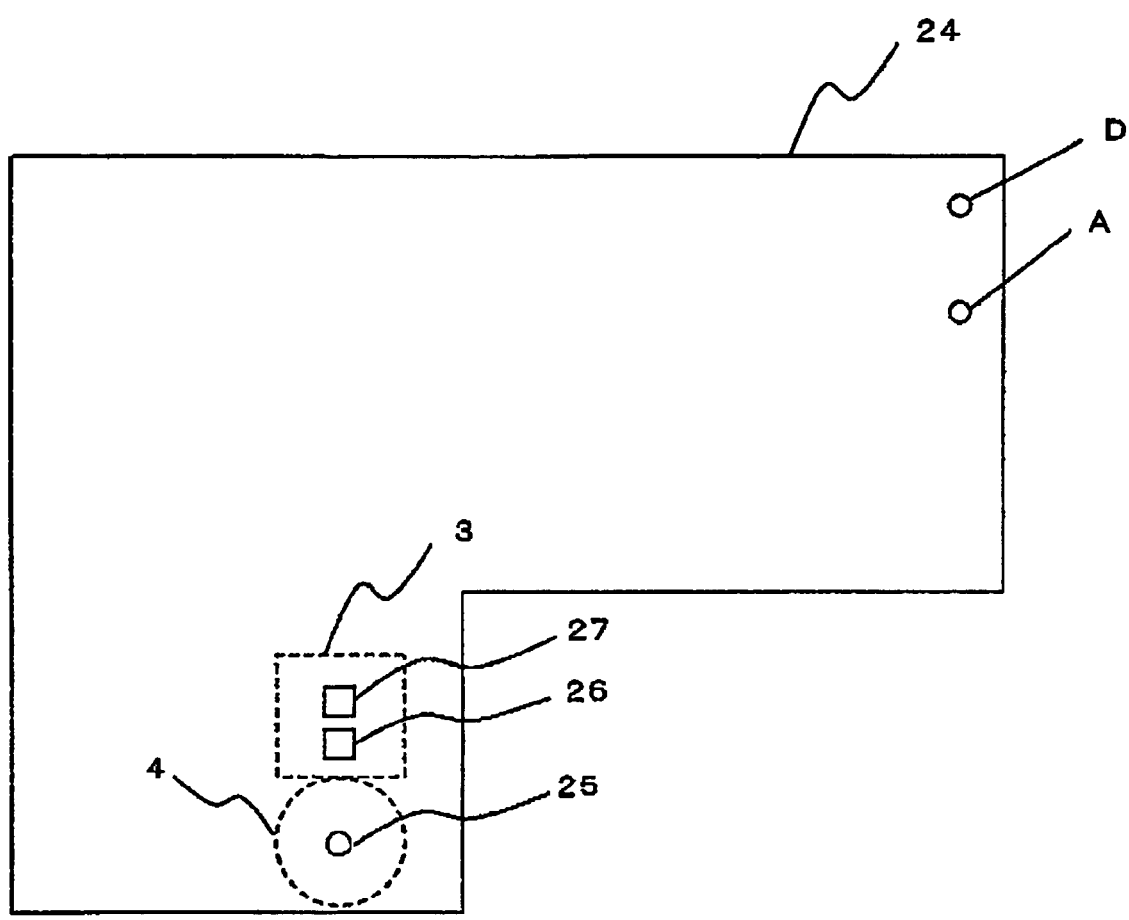
FIG. 8 A top plan view showing the configuration of the top heat radiation plate of the second cooling panel configuring the second cooling panel member shown in FIG. 6.

The second cooling panel 2 is such that a bottom heat radiation plate 23 and a top heat radiation plate 24 shown in FIGS. 7 and 8, respectively, are bonded together by using a bonding technique such as diffusion bonding, braze bonding or laser bonding. A groove 231 formed on the bottom heat radiation plate 23 of the second cooling panel is covered by the top heat radiation plate 24, to thereby form the passage 21. The formation of the groove 231 on the bottom heat radiation plate 23 of the second cooling panel 2 may be performed by pressing to form the groove 231, by molding in the state of having the groove 231, or by grinding to form the groove 231. Further, the groove may be formed on the top heat radiation plate 24, or may be formed on both the top heat radiation plate 23 and bottom heat radiation plate 24.

Figure 9:
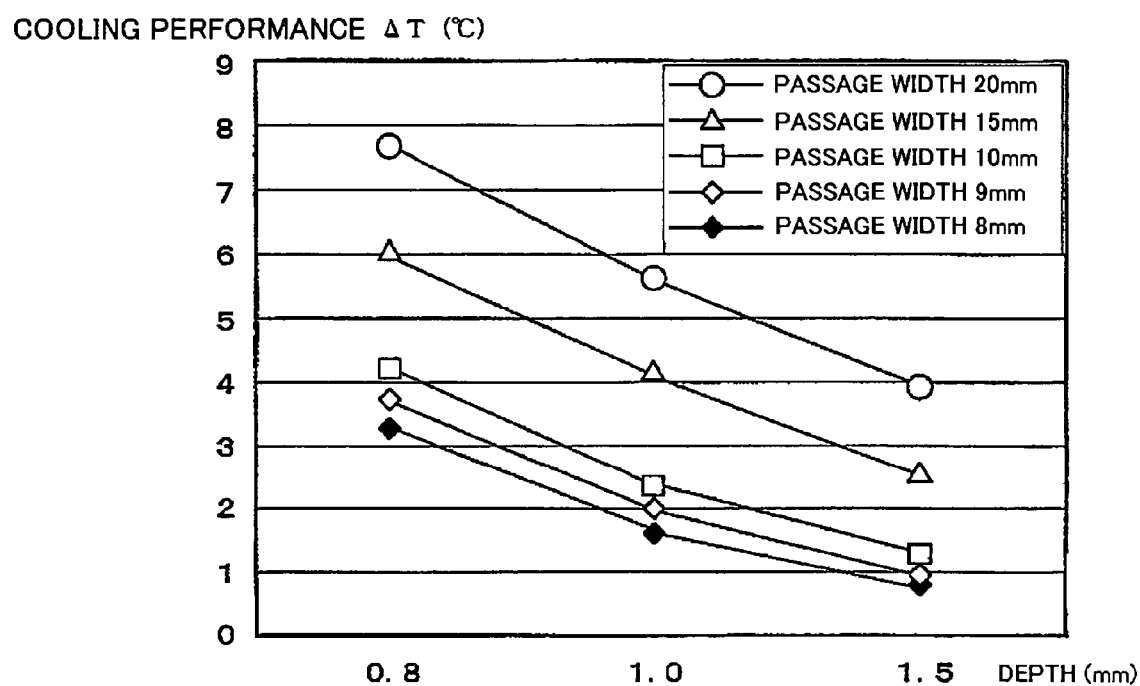
FIG. 9 A graph showing the relationship between the width and depth of the passage shown in FIG. 6 and the cooling performance.
Figure 10:
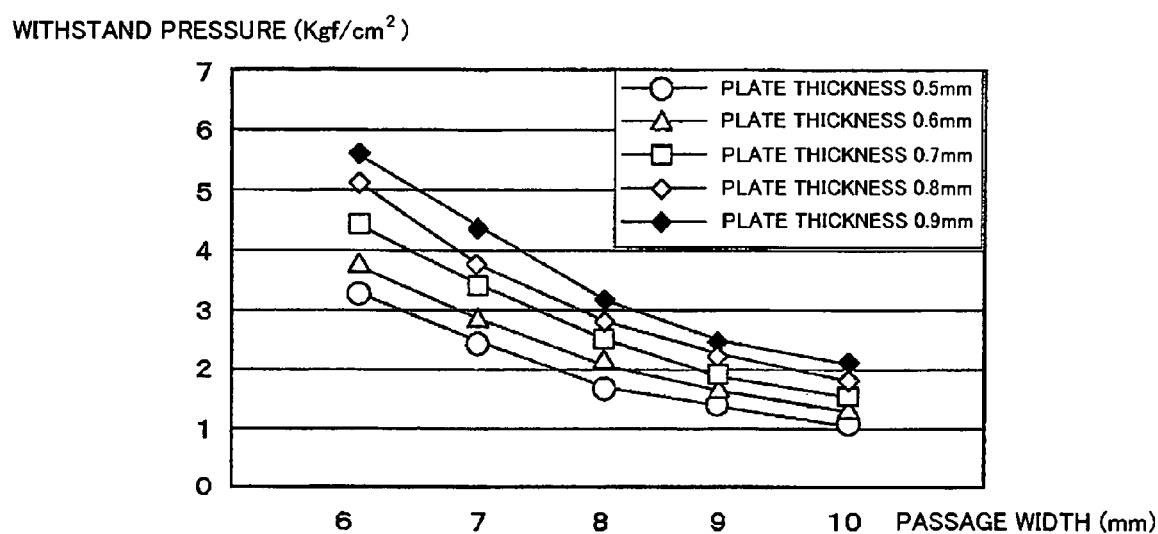
FIG. 10 A graph showing the relationship between the width and plate thickness of the passage shown in FIG. 6 and the resistance performance to pressure.

The central portion of the passage 21 of the second cooling panel 2, i.e., the central portion of the groove 231 formed on the bottom heat radiation plate 23 of the second cooling panel 2 is provided with a plurality of struts 22 arranged at a constant pitch. The struts 22 assure the strength during bonding together the bottom heat radiation plate 23 and top heat radiation plate of the second cooling panel. The relationship between the width and depth of the passage 21 and the cooling performance is such that a larger width or a smaller depth of the passage improves the cooling performance as shown in FIG. 9. However, a smaller width of the passage or a smaller plate thickness reduces the withstand-pressure performance, as shown in FIG. 10. Accordingly, the passage 21 is required to have a larger width and a smaller depth in the view point of the cooling performance, which reduces the withstand-pressure performance however. Thus, in the first embodiment, the object of the struts 22 is to improve the withstand-pressure performance. Although the struts 22 are formed at the central portion of the passage 21 in the first embodiment, the location of the struts 22 is not limited to the central portion, and the struts may be arranged in a lattice or zigzag fashion, for example. In the first embodiment, the passage 21 formed in the second cooling panel 2 was 20 mm wide and 0.8 mm deep, and the struts 22 having a width of 0.5 mm and as length of 2 mm were formed at a 20 mm pitch in the central portion of the passage 21.

The top heat radiation plate 24 of the second cooling panel is provided with an opening (branch hole) 25 communicated with the reservoir 4, a refrigerant outlet port 26 through which the refrigerant flows out of the passage 21 toward the circulation pump 3, a refrigerant inlet port 27 through which the refrigerant flows in from the circulation pump 3 toward the passage 21, an opening A configuring an outlet port through which the refrigerant flows out of the passage 21, and an opening D configuring an inlet port through which the refrigerant flows into the passage 21. The opening A and opening D are coupled to metallic tube 14 and metallic tube 15, respectively. A micro-channel structure may be formed in the second cooling panel 2.

Hereinafter, the flow of the refrigerant in the first embodiment will be described in detail.

The refrigerant discharged from the circular pump 3 provided on the top surface of the second cooling panel 2 passes through the refrigerant inlet port 27 to the passage 21 formed in the second cooling panel 2, and flows into the first cooling panel 1 via the opening A, metallic tube 14 and opening B. The refrigerant flowing into the first cooling panel 1 passes through the passage 11 formed in the first cooling panel 1 to flow into the micro-channel structure 12.

The refrigerant flowing into the micro-channel structure 12 absorbs the heat generated by the heating parts 7, passes through the wobbled passage 111 formed in the area in which the air-cooled fins 13 are provided, to flow into the second cooling panel 2 via the opening C, metallic tube 15 and opening D. The refrigerant flowing into the second cooling panel 2 passes through the passage 21 formed in the second cooling panel 2, reaches the refrigerant outlet port 26 after passing underneath the opening 25 communicated with the reservoir 4, and again flows into the circulation pump 3.

By circulating the refrigerant by using the circulation pump 3, as described above, the heat generated by the heating parts 7 is diffused by heat conduction over the entirety of the first cooling panel 1 and second cooling panel 2, thereby improving the heat radiation effect.

Next, a first configuration example of the circulation pump 3 which is attached to the top heat radiation plate 24 of the second cooling panel 2 at the top side thereof will be described in detail with reference to FIGS. 11 and 12.

Figure 11:
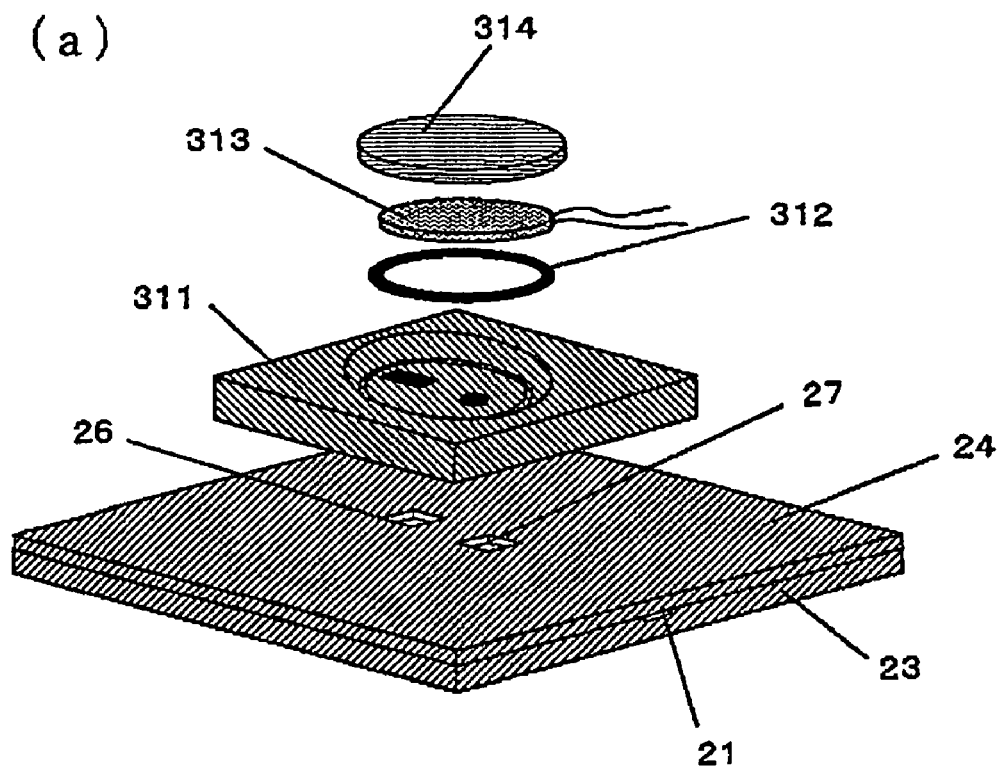
FIG. 11(a) is an exploded perspective view of a first example of the circulation pump shown in FIG. 1, and (b) is a side view in section thereof.
Figure 11:
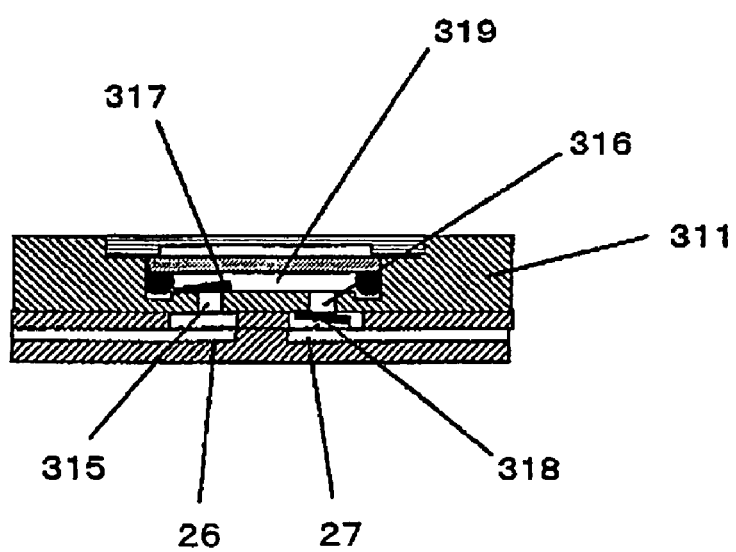
Figure 12:
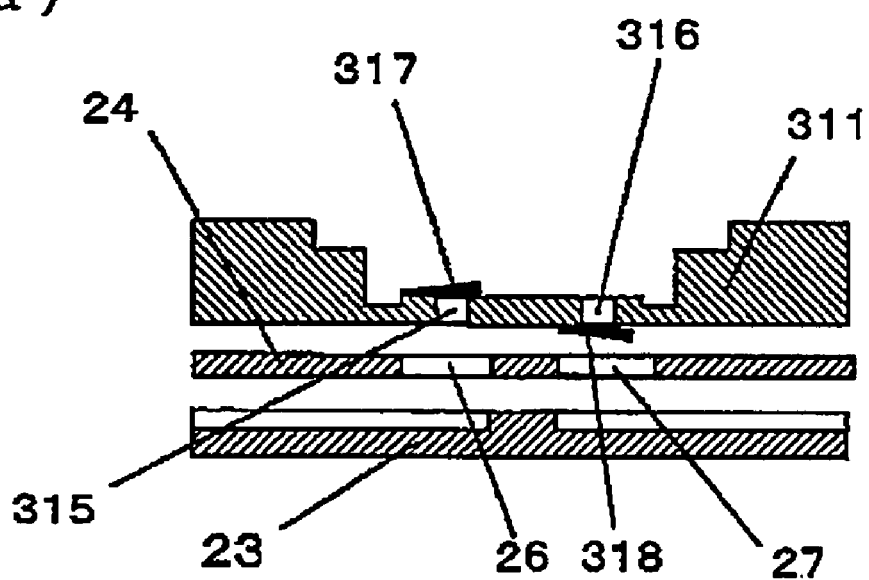
FIGS. 12(a) and (b) are side views in section showing a mounting technique for the circulation pump shown in FIG. 11.
Figure 12:
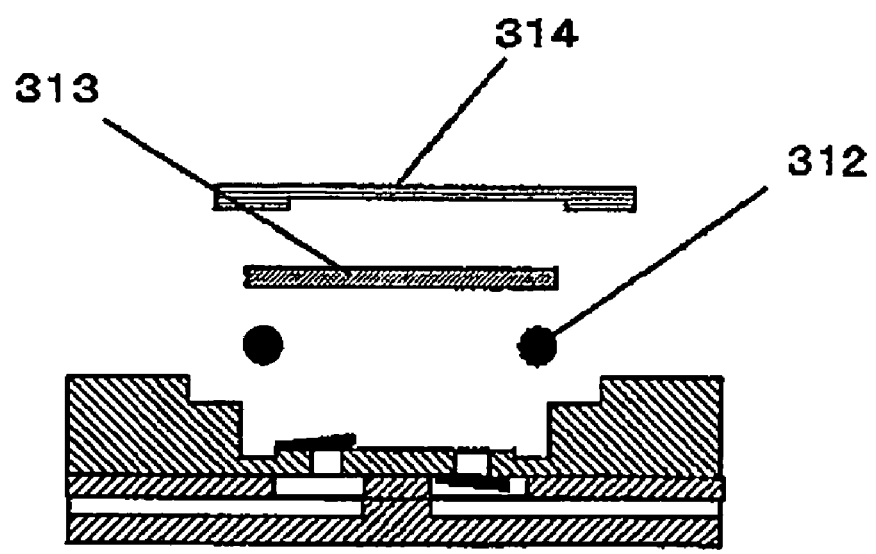

FIG. 11 illustrates the first configuration example of the circulation pump shown in FIG. 1, wherein (a) is an exploded perspective view, and (b) is a side view in section thereof. FIG. 12 is a side view in section showing the mounting process for the circulation pump illustrated in FIG. 11.

Referring to FIG. 11, the first configuration example of the circular pump 3 includes a pump housing 311, an O-ring 312 made of rubber resin, a piezoelectric vibration plate 313, a top plate 314 for pressing the piezoelectric vibration plate 313. The pump housing 311 is provided with a suction port 315 and a discharge port 316 which oppose the refrigerant outlet port 26 and refrigerant inlet port 27, respectively, formed on the top heat radiation plate 24 of the second cooling panel, and defines therein a space configuring a pump chamber 319. The suction port 315 is provided with an inlet check valve 317 which prevents a back-flow from the pump chamber 319 to the passage 21, whereas the discharge port 316 is provided with an outlet check valve 318 which prevents a back-flow from the passage 21 to the pump chamber 319. The inlet check valve 317 and outlet check valve 318 are configured each by a thin metallic reed valve, and coupled to the bottom surface of the pump housing 311 by using spot welding or screws.

The piezoelectric vibration plate 313 is a piezoelectric-bended vibration plate used as a driving source of the circulation pump 3, is configured by bonding together a piezoelectric element and an elastic plate, and is subjected to liquid-tight molding so that the piezoelectric element does not directly contact the refrigerant liquid. Piezoelectric ceramic or piezoelectric single crystal may be used for the piezoelectric element. A thin metallic plate such as made of copper alloy e.g., bronze phosphate or stainless alloy, or a thin carbon fiber plate or resin plate such as PET plate may be used as the elastic plate. The detailed structure of the piezoelectric vibration plate 313 may be a uni-morph, bimorph etc., or otherwise a layered structure including layered piezoelectric elements.

Referring to FIG. 12(a), the mounting process for the circulation pump shown in FIG. 11 includes the first step of bonding the pump housing 311 onto the top heat radiation plate 24 of the second cooling panel to form an integral body for fixing together, by using a bonding technique such as diffusion bonding, braze bonding or laser bonding. In this step, the suction port 315, discharge port 316, space for the pump chamber 319, inlet check valve 317 and outlet check valve 318 are formed and bonded in/to the pump housing 311.

Thereafter, as shown in FIG. 12(b), the O-ring 312 is inserted, and the piezoelectric vibration plate 313 is mounted thereon, to thereby configure the pump chamber 319. Then, the O-ring 312 is firmly compressed and closely contacted by using the top plate 314 for assuring the liquid-tight and for allowing the piezoelectric vibration plate 313 to be fixed at the periphery thereof. In this step, the top plate 314 may be fixed with screws from the top or may be fastened after providing the periphery of the top plate 314 with screws.

As described above, in the first configuration example of the circulation pump 3, the circulation pump 3 and the second cooling panel 2 are coupled together using a metallic bonding technique to form a perfect integral body, thereby preventing the pressure loss, leakage of liquid etc. In addition, the structure of the integral body of the circulation pump 3 and second cooling panel 2 allows smaller thickness and lower cost thereof. Use of this structure for the circulation pump 3 achieves a smaller-thickness cooling device having a height as small as 7 mm or smaller at the maximum portion at which the circulation pump 3 is arranged.

Figure 14:
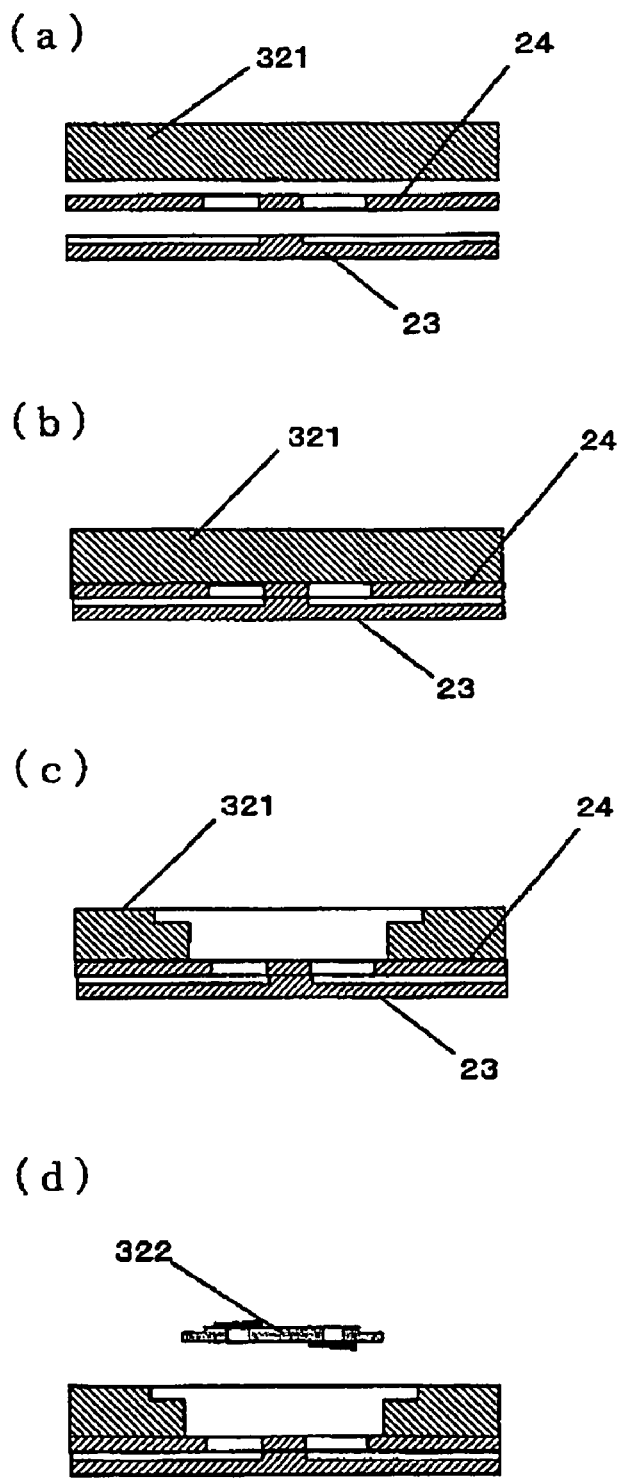
FIG. 14(a) to (d) are side views in section showing a mounting technique for the circulation pump shown in FIG. 13.
Figure 15:
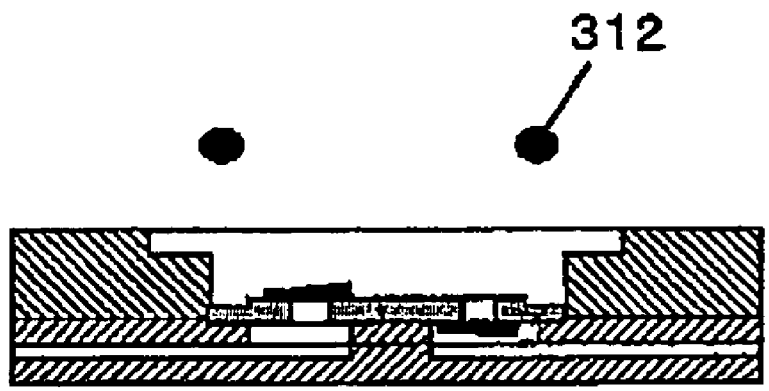
FIGS. 15(a) and (b) are side views in section showing a mounting technique for the circulation pump shown in FIG. 13.
Figure 15:
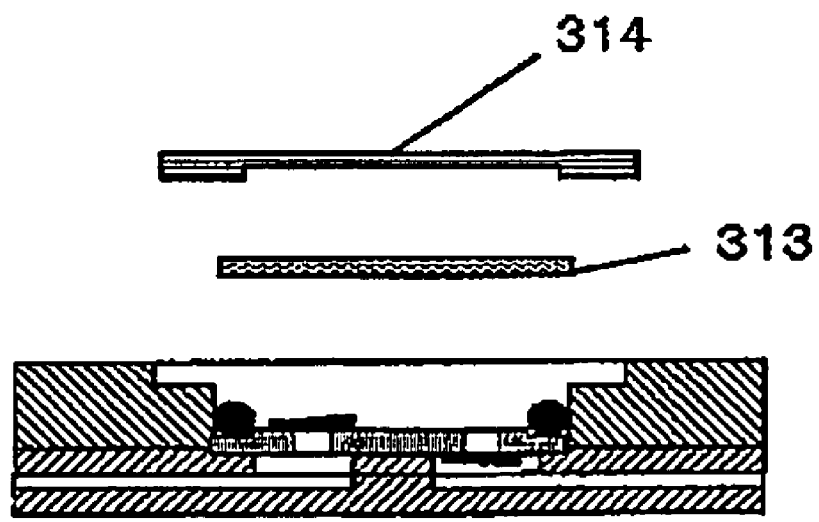

Thereafter, a second configuration example of the circulation pump 3 which is attached to the top heat radiation plate 24 of the second cooling panel 2 at the top side thereof will be described in detail with reference to FIGS. 13 through 15.

Figure 13:
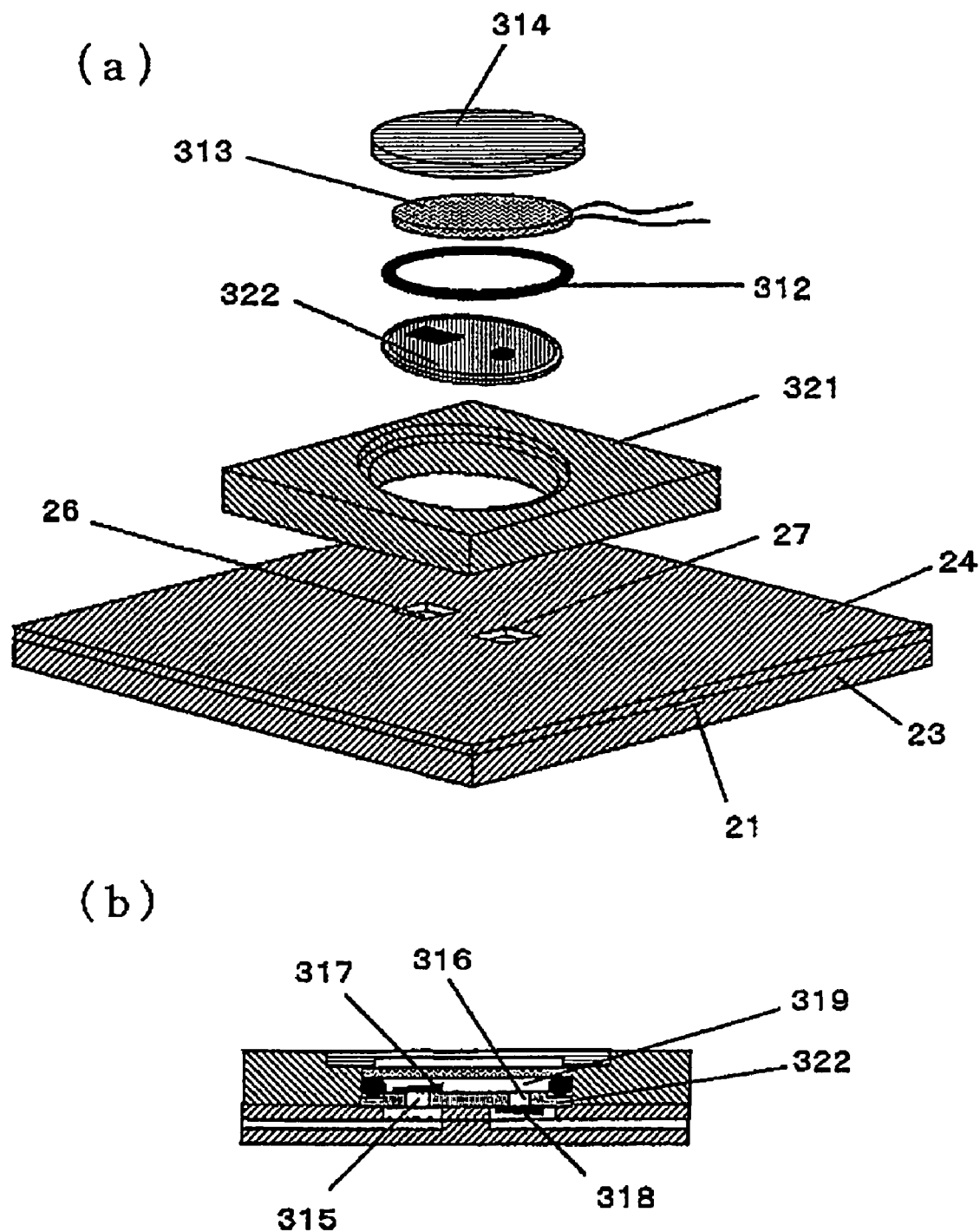
FIG. 13(a) is an exploded perspective view of a second example of the circulation pump shown in FIG. 1, and (b) is a side view in section thereof.

FIG. 13 shows the second configuration example of the circulation pump shown in FIG. 1, wherein (a) is an exploded perspective view, and (b) is a side view in section thereof. FIGS. 14 and 15 are side view in section showing the mounting process for the circulation pump illustrated in FIG. 13.

Referring to FIG. 13, the second configuration example of the circulation pump 3 is comprised of a pump housing 231, a check-valve-formed circular plate 322, an O-ring 312 made of rubber resin, a piezoelectric vibration plate 313, and a top plate 314 for pressing the piezoelectric vibration plate 313. The check-valve-formed circular plate 322 is provided with a suction port 315 and a discharge port 316 formed so as to oppose the refrigerant outlet port 26 and refrigerant inlet port 27, respectively, formed in the top heat radiation plate 24 of the second cooling panel. The suction port 315 is provided with an inlet check valve 317 for preventing the back-flow from the pump chamber 319 to the passage 21, whereas the discharge port 316 is provided with an inlet check valve 318 for preventing the back-flow from the passage 21 to the pump chamber 319. The inlet check valve 317 and outlet check valve 318 are configured each by a thin metallic reed valve, and coupled to the check-valve-formed circular plate 322 by using spot welding or screws.

Referring to FIGS. 14(a) to 14(c), the mounting process for the circular pump 3 shown in FIG. 13 includes the first step of bonding the pump housing 321 onto the top heat radiation plate 24 of the second cooling panel by using a bonding technique, such as diffusion bonding, braze boding or laser welding, to form an integral body. In the pump housing 603, a portion to be configured as the pump chamber 319 may be formed prior to or subsequent to this step.

Thereafter, as shown in FIG. 14(d), the check-valve-formed circular plate 322 in/to which the suction port 315, discharge port 316, inlet check valve 317 and outlet check valve 318 are formed and bonded is inserted within the pump housing 321.

Thereafter, as shown in FIG. 15(a), the O-ring 312 is inserted, and the piezoelectric vibration plate 313 is mounted thereon, as shown in FIG. 15(b), thereby configuring the pump chamber 319. Subsequently, the O-ring 312 is firmly compressed and closely contacted by using the top plate 314 for assuring the liquid-tight and for allowing the piezoelectric vibration plate 313 to be fixed at the periphery thereof. In this step, the top plate 314 may be fixed with screws from the top, or may be fastened after providing the periphery of the top plate with screws.

As described above, in the second configuration example of the circulation pump 3, the suction port 315, discharge port 316, inlet check valve 317 and outlet check valve 318 are formed in and bonded onto the check-valve-formed circular plate 322 in advance, whereby the check-valve-formed circular plate 322 can be replaced as a whole. In this configuration, if the pump performance is degraded due to the clogging of the suction port 315 or discharge port 316 or due to plastic deformation of the inlet check valve 317 or outlet check valve 318 after a long-term service, it is sufficient that the check-valve-formed circular plate 322 be replaced to recover the pump performance, thereby allowing an easy maintenance.

Figure 16:
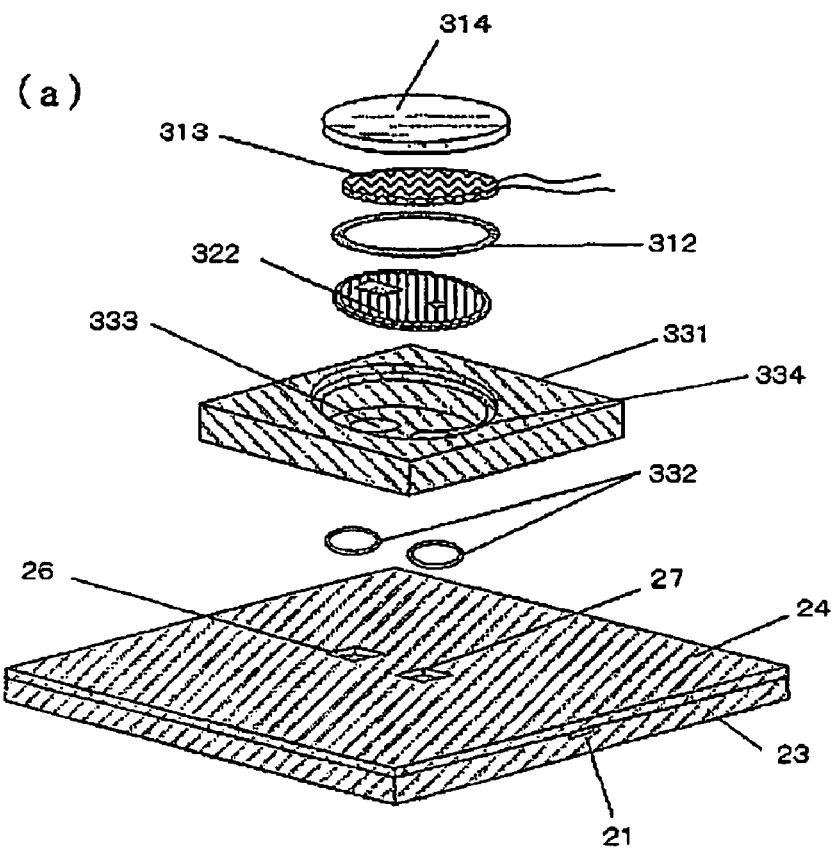
FIG. 16(a) is an exploded perspective view of a third example of the circulation pump shown in FIG. 1, and (b) is a side view in section thereof.
Figure 16:
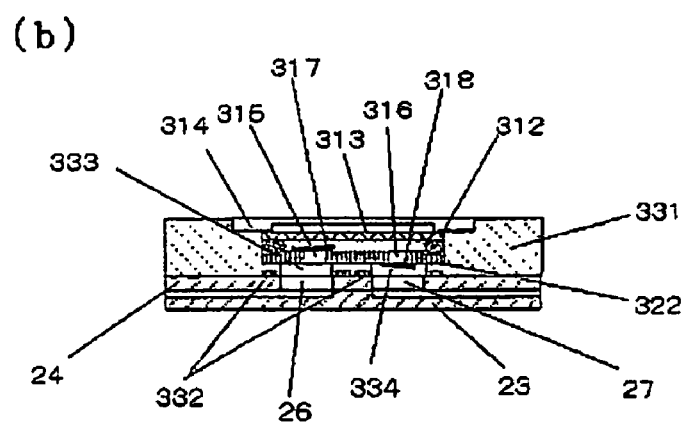
Figure 17:
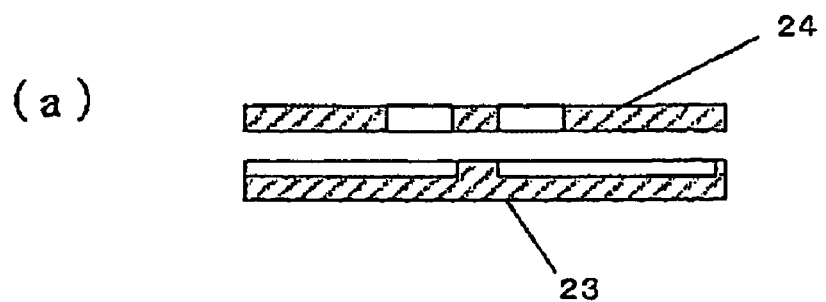
FIG. 17(a) to (c) are side views in section showing a mounting technique for the circulation pump shown in FIG. 16.
Figure 17:
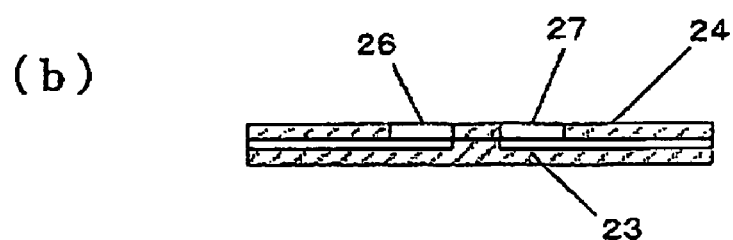
Figure 17:
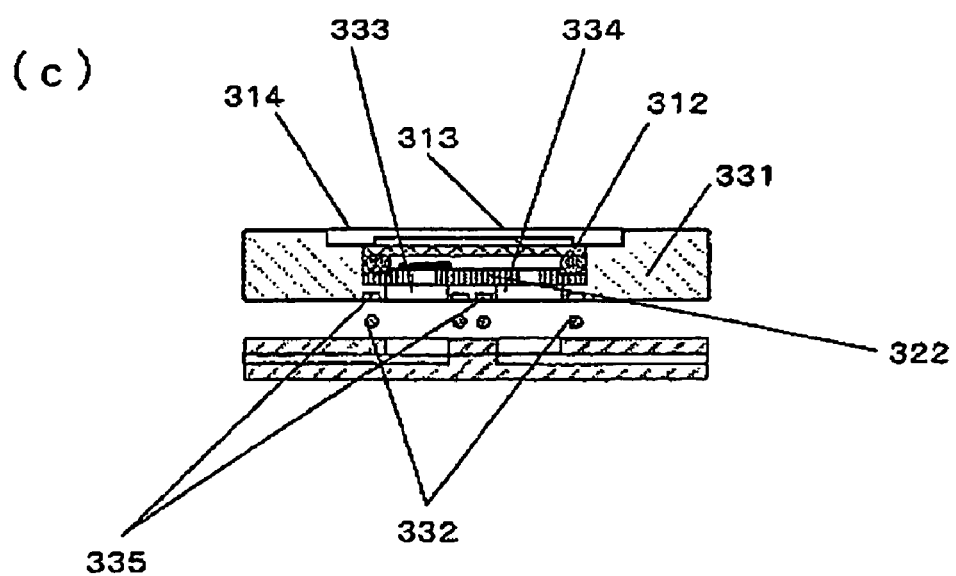

Thereafter, a third configuration example of the circulation pump 3 attached to the top heat radiation plate 24 of the second cooling panel on the top surface thereof will be described in detail with reference to FIGS. 16 and 17. FIG. 16 illustrates the third configuration example of the circular pump 3 shown in FIG. 1, wherein (a) is an exploded perspective view and (b) is a side view in section thereof. FIG. 17 is a side view in section showing a mounting process for the circulation pump illustrated in FIG. 16.

Referring to FIG. 16, the third configuration example of the circulation pump 3 is comprised of a pump housing 331, a check-valve-formed circular plate 322, an O-ring 312 made of rubber resin, a piezoelectric vibration plate 313 and a top plate 314 for pressing the piezoelectric vibration plate 313. The bottom surface of the pump housing 331 is provided with a pump-bottom-surface inlet port 333 and a pump-bottom-surface outlet port 334, which are formed so as to oppose the refrigerant outlet port 26 and refrigerant inlet port 27, respectively, formed in the top heat radiation plate 24 of the second cooling panel.

The pump-bottom-surface inlet port 333 and pump-bottom-surface outlet port 334 are coupled to the suction port 315 and discharge port 316, respectively, of the check-valve-formed circular plate 322. The suction port 315 is provided with an inlet check valve 317 for preventing the back-flow from the pump chamber 319 to the passage 21, whereas the discharge port 316 is provided with an outlet check valve 318 for preventing the back-flow from the passage 21 to the pump chamber 319. The inlet check valve 317 and outlet check valve 318 are configured each by a thin metallic reed valve, and coupled to the check-valve-formed circular plate 322 by using spot welding or screws.

Referring to FIGS. 17(a) and 17(b), the mounting process for the circulation pump 3 shown in FIG. 16 includes the first step of bonding together the second-cooling-panel top heat radiation plate 24 and the second-cooling-panel bottom heat radiation plate by using a metallic bonding technique, such as diffusion bonding, braze bonding or laser bonding, to thereby form an integral body.

Thereafter, the check-valve-formed circular plate 322 in/to which the suction port 315, discharge port 316, inlet check valve 317 and outlet check valve 318 are formed and bonded is inserted within the pump housing 331. Subsequently, the O-ring 312 is inserted, the piezoelectric vibration plate 313 is mounted thereon, and the O-ring 312 is firmly compressed and closely contacted by using the top plate 314 for assuring the liquid-tight and for fixing the piezoelectric vibration plate 313 at the periphery thereof, thereby installing the circulation pump 3 in advance. In this step, the top plate 314 may be fixed with screws from the top, or may be fastened after providing the periphery of the top plate with screws.

Thereafter, as shown in FIG. 17(c), O-rings 332 are inserted in O-ring grooves 335 formed on the bottom surface of the pump so as to isolate the pump-bottom-surface inlet port 333 from the pump-bottom-surface outlet port 334, followed by fastening together the circulation pump 3 and the second cooling panel 2 with screws to finish the mounting.

As described above, in the third configuration example of the circulation pump 3, an easy maintenance such as by replacement of the circulation pump 3 for dealing with degradation in the performance of the circular pump 3 can be obtained, while achieving a lower cost. The bonding of the circular pump 3 and the second cooling panel 2 assures the liquid-tight to a sufficient extent, although not so high extent as achieved by the metallic bonding used in the first and second configuration examples.

Next, the configuration of the reservoir 4 attached onto the top heat radiation plate 24 of the second cooling panel at the top surface thereof will be described in detail with reference to FIGS. 18 to 20.

Figure 18:
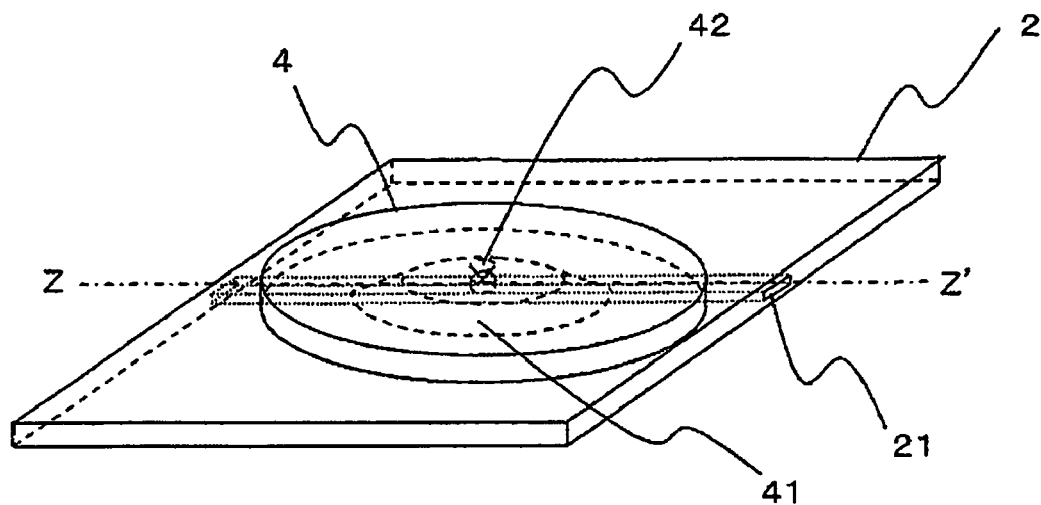
FIG. 18 A perspective view showing the configuration of the reservoir shown in FIG. 1.
Figure 19:
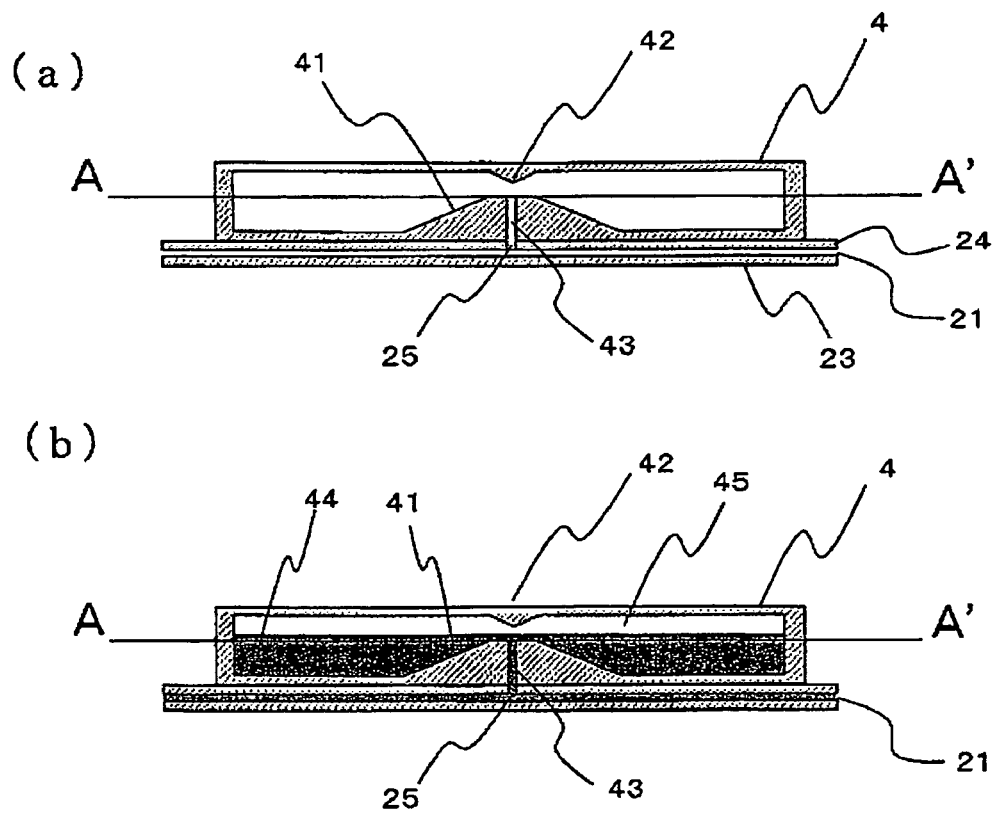
FIGS. 19(a) and (b) are sectional views taken along line Z-Z' in FIG. 18.
Figure 20:
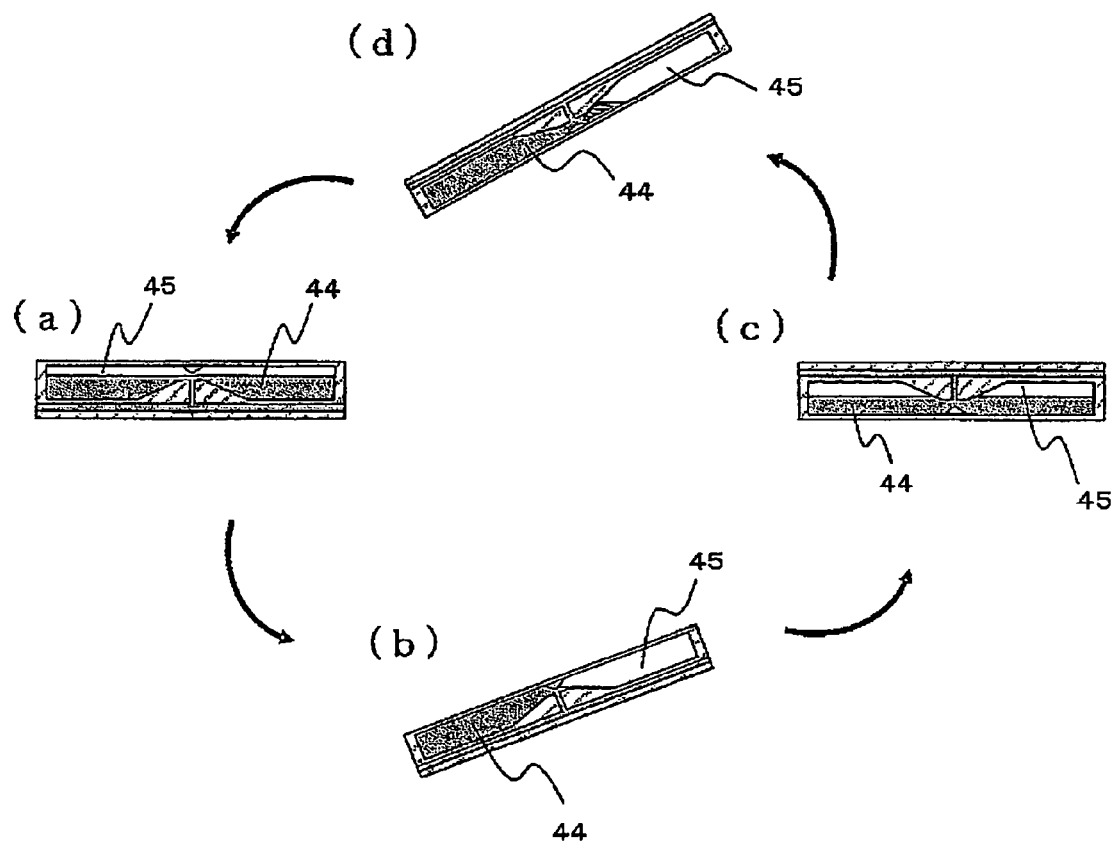
FIG. 20(a) to (d) are explanatory views for showing the air storage function of the reservoir shown in FIG. 18.

FIG. 18 is a perspective view showing the configuration of the reservoir shown in FIG. 1, FIG. 19 is a sectional view taken along line Z-Z' in FIG. 18, and FIG. 20 is an explanatory view for describing the air storage function of the reservoir shown in FIG. 18.

The reservoir 4 is a laid-down-type reservoir of a hollow disk as shown in FIG. 6, and fixed onto the top heat radiation plate 24 to overlie the passage 21 at the upstream side of the circulation pump 3 (upstream of the inlet of the refrigerant into the circulation pump 3). Referring to FIGS. 18 and 19, the reservoir is arranged so that the branch hole 43 provided in the bottom surface of the reservoir 4 is aligned with the opening 25 formed in the top heat radiation plate 24 of the second cooling panel. The branch hole 43 communicated with the reservoir 4 has a smaller cross-sectional area compared to the passage 21 to thereby increase the acoustic impedance and thus minimizes the inlet flow rate of the refrigerant into the reservoir 4 without impeding the flow of the refrigerant through the passage 21.

Since the reservoir 4 having the branch hole 43 is coupled to the passage 21 at the top side thereof, air bubbles appearing in the passage 21 due to a temperature change etc. are trapped by the overlying reservoir 4 through the opening 25 formed in the top radiation plate 24 of the second cooling panel. The air 45 trapped enters the reservoir 4 through the branch hole 43. If the air stops in the vicinity of the exit of the branch hole 43, other air 45 subsequently trapped cannot enter the reservoir 4. In view of this, a protrusion 42 is formed on the cap of the reservoir 4 at a position overlying the exit of the branch hole 43 so as not to allow the air to stop at the vicinity of the exit of the branch hole 43. The protrusion 42 diffuses the air 45 exiting through the exit of the branch hole 43 toward the periphery thereof. The protrusion 42, if formed as a conical shape, can effectively prevent the detention of air. The configuration, wherein the protrusion 42 has a downwardly convex portion and the convex portion has an area smaller than the area of the branch hole, achieves the prevention of the detention of air 45.

The air 45 trapped in the reservoir 4 acts for alleviating the pressure change in the passage 21 caused by expansion and compression of the liquid due to a temperature change, thereby contributing an improvement in the decay endurance of the cooling device. On the other hand, if the air 45 trapped enters the passage 21 to flow into the circulation pump, there arises a possibility that the discharge pressure of the circulation pump 3 is reduced to degrade the performance of the circulation pump 3, whereby the flow rate of the refrigerant is considerably reduced. Thus, the bottom surface of the reservoir 4 is provided with a taper portion 41 of a truncated conical shape having an apex at the exit of the branch hole 43, as shown in FIGS. 18 and 19. The taper portion 41 allows the air 45 trapped in the reservoir 4 to stay therein as much as possible, even if the cooling device is turned upside down. For the air trapped in the reservoir 4 not to return to the passage, it is necessary that the exit of the branch hole 43 be immersed in the refrigerant at any time. In the first embodiment, the boundary surface A-A' at which the exit of the branch hole 43 is located is configured so that the volume of the reservoir 4 below the boundary surface A-A' is smaller than the volume of the reservoir above the boundary surface A-A', whereby the reservoir 4 is filled with the refrigerant 44 so that the liquid level of the refrigerant 44 is located in the reservoir 4 above the boundary surface A-A', as shown in FIG. 19(b).

The normal state in which the cooling device of the first embodiment is used is such that shown in FIG. 20(a), wherein the air 45 stays in the upward position because the air 45 has a lower specific density than the refrigerant 44. It is to be noted that the refrigerant 44 is filled in the reservoir 4 so that the exit of the branch hole 43 (the apex of the taper of the taper portion 41) is located within the liquid. In addition, the volume of the reservoir 4 is designed to have a sufficient volume for endurance in consideration of the amount of heat expansion of the refrigerant 44 as well as the heat expansion and withstand pressure of the reservoir 4.

If the cooling device is inclined into a slanted state in the next stage, the reservoir 4 assumes the posture shown in FIG. 20(b), wherein the air 45 in the reservoir 4 stays to be deviated in a specific direction. In this state either, the exit of the branch hole 43 does not stay away from the liquid, whereby the air 45 in the reservoir 4 does not enter the branch hole 43.

If the cooling device is further inclined to be turned upside down in the next stage, the reservoir 4 assumes the posture shown in FIG. 20(c). In this state either, the refrigerant 44 is filled at above the boundary surface A-A', due to the configuration wherein the bottom surface of the reservoir 4 is provided with the taper portion 41 and thus the volume of the reservoir 4 below the boundary surface A-A' shown in FIG. 20 is larger than that above the boundary surface. Thus, the exit of the branch hole 43 is immersed in the refrigerant 44 at any time so that the air 45 remains to stay in the reservoir 4 and does not enter the branch hole 43.

If the cooling device is further inclined in the next stage, the reservoir 4 shifts from the posture shown in FIG. 20(c) to the posture shown in FIG. 20(d), whereby the air 45 in the reservoir 4 rises on the taper surface of the taper portion 41. After the air 45 reaches the vicinity of the exit of the branch hole 43, it stays in the opposite location. In this state, the cross-sectional area of the branch hole 43 is extremely small so that the air 45 passes over the branch hole 43 to thereby stay in the opposite location.

For verification of the effectiveness of the reservoir 4 in the first embodiment, a prototype cooling device including a branch hole having a 2-mm diameter and a reservoir 4 having a 50-mm diameter and a 7-mm height (taper portion 41 having a 4-mm vertical interval) was manufactured. This cooling device was coupled to a commercially available high-pressure pump for conducting a withstand-pressure test, wherein a pressure having an amplitude of 0 to 1 MPa and a frequency of 10 Hz was applied in an assumption of a steep temperature change being applied to the electronic equipment.

In the results of the test, without the reservoir 4, an instant leakage was observed at a pressure of 200 kPa (twice the normal pressure) due to peel-off in the bottom wall and passage plate, whereas the leakage was not observed in case of provision of the reservoir 4 up to a pressure of 1 MPa (10 normal pressures) and a frequency of 150000 cycles, whereby an improvement in the withstand-pressure performance of the reservoir 4 was assured in the first embodiment.

As described above, the reservoir 4 in the first embodiment has an advantage in that the reservoir can be arranged two-dimensionally for a portion or the entirety of the passage 21 extending in a two-dimensional plane, whereby a small thickness can be achieved. It is to be noted that this type of the reservoir 4 can be provided in a plurality thereof for achieving a larger advantage over a single one. If the reservoir 4 is detachably provided, there is a larger advantage in that the refrigerant is replenished if the amount of refrigerant should be reduced in the cooling device.

Next, an example of assembly of the cooling device of the first embodiment into an electronic equipment will be described in detail with reference to FIGS. 21 to 25.

Figure 21:
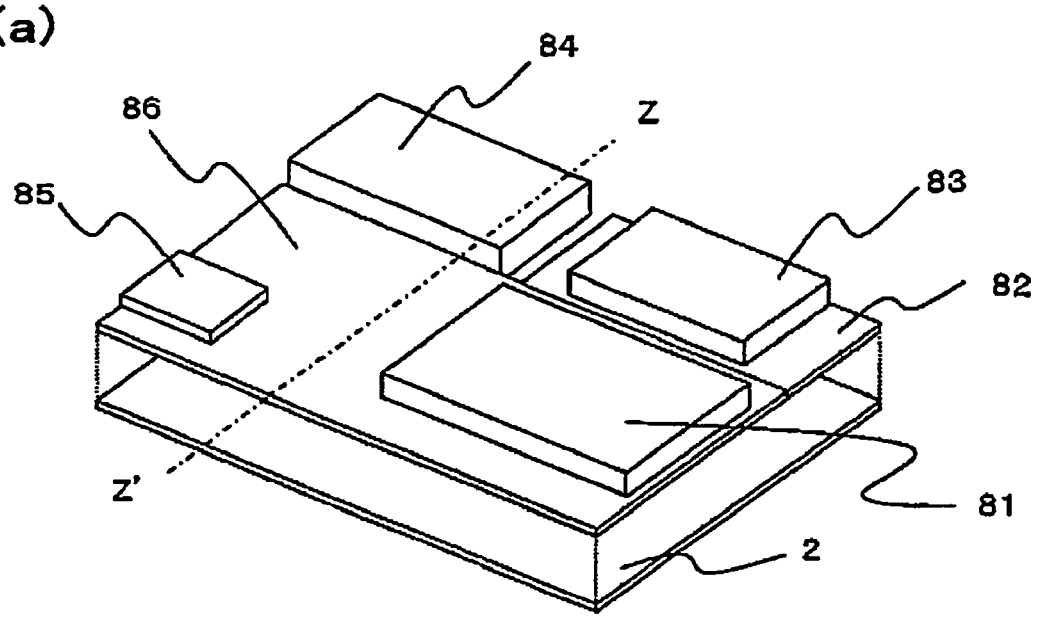
FIG. 21(a) is a perspective view showing a first example of assembling the cooling device for an electronic equipment according to the present invention into the electronic equipment, and (b) is a sectional view taken along line Z-Z' in (a).
Figure 21:
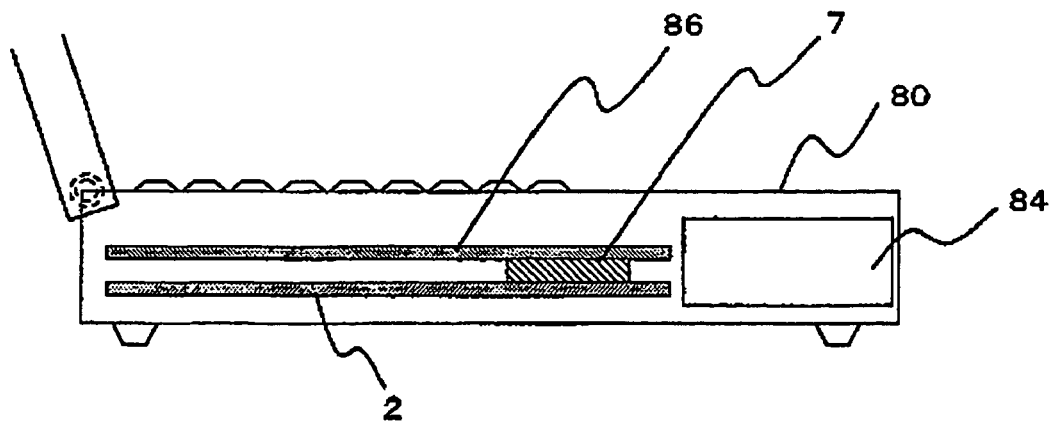
Figure 22:
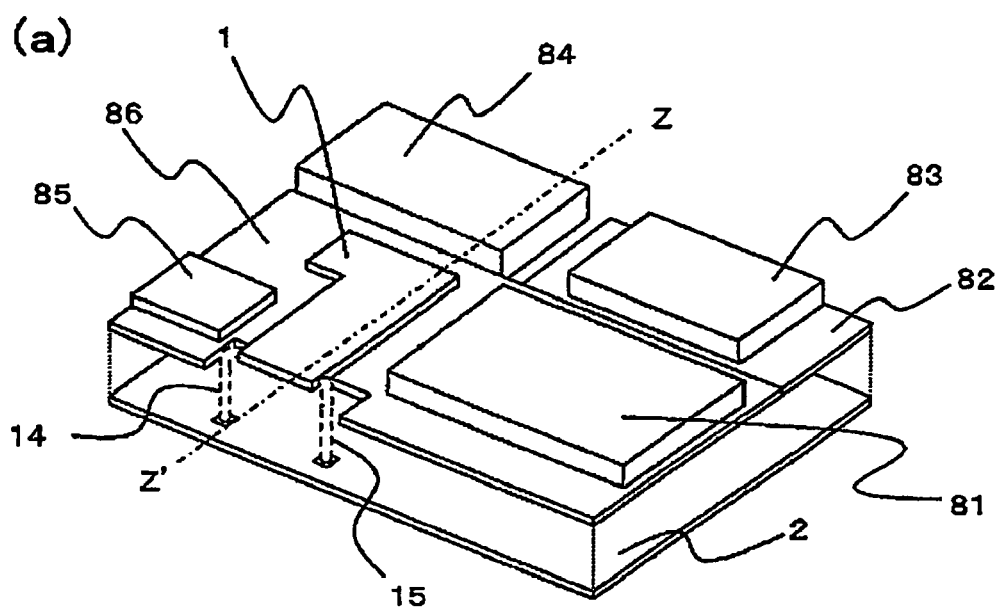
FIG. 22(a) is a perspective view showing a second example for assembling the cooling device for an electronic equipment according to the present invention into the electronic equipment, and (b) is a sectional view taken along line Z-Z' in (a).
Figure 22:
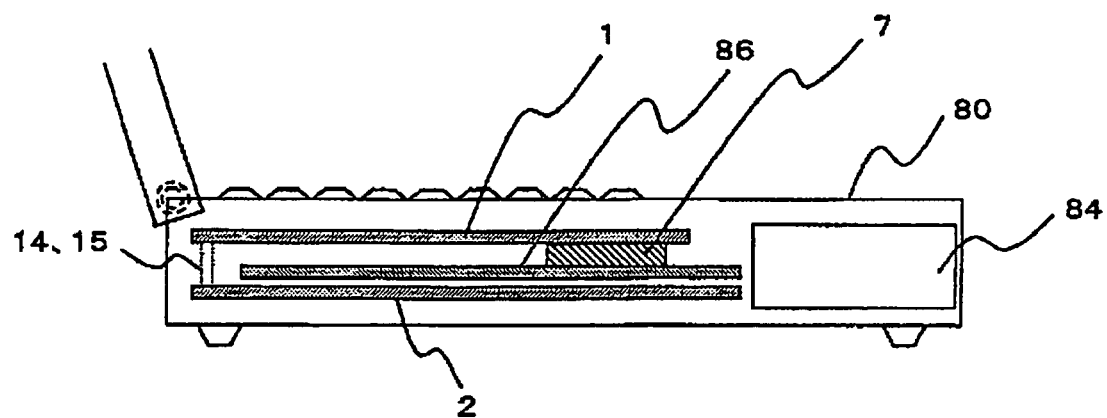
Figure 23:
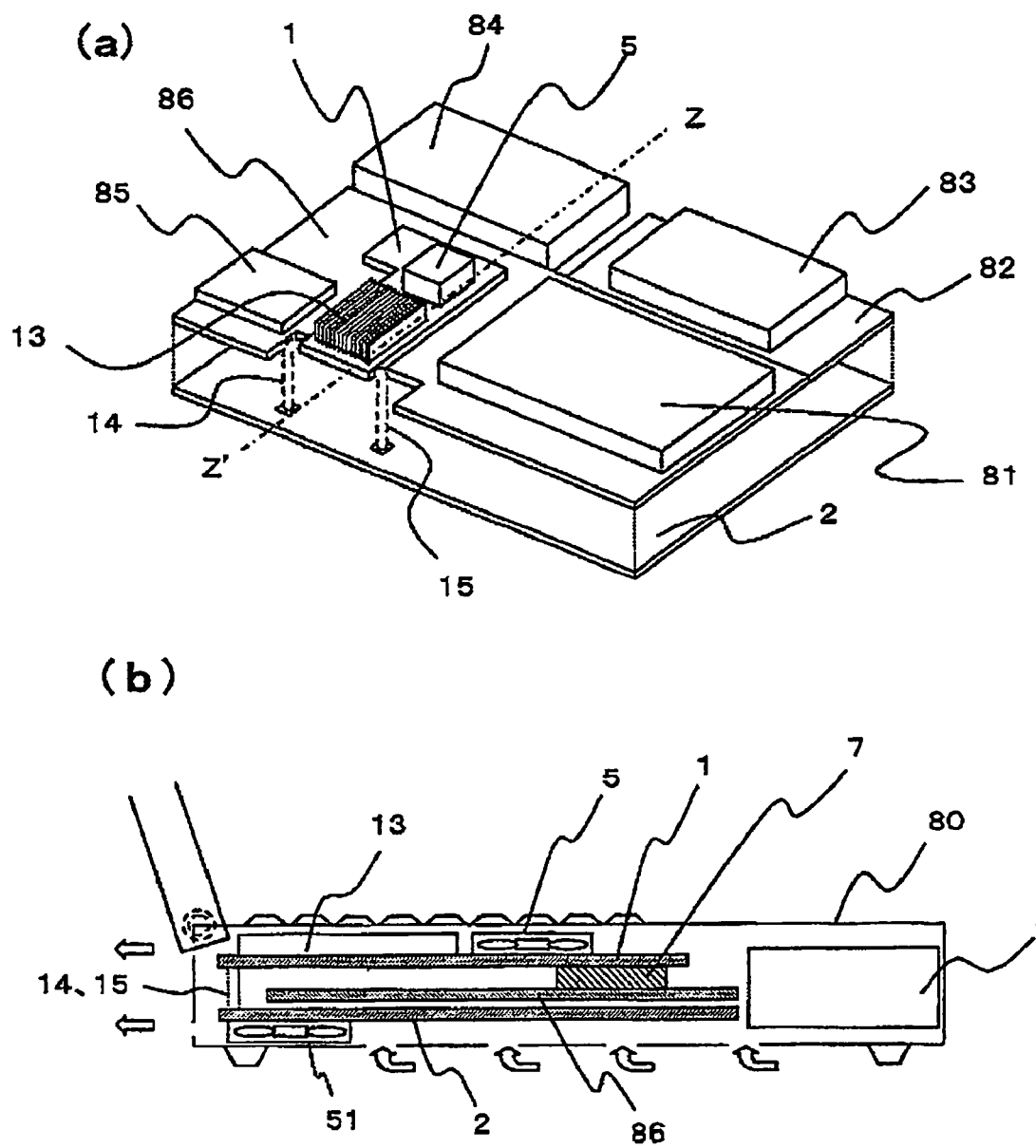
FIG. 23(a) is a perspective view showing a third example for assembling the cooling device for an electronic equipment according to the present invention into the electronic equipment, and (b) is a sectional view taken along line Z-Z' in (a).
Figure 24:
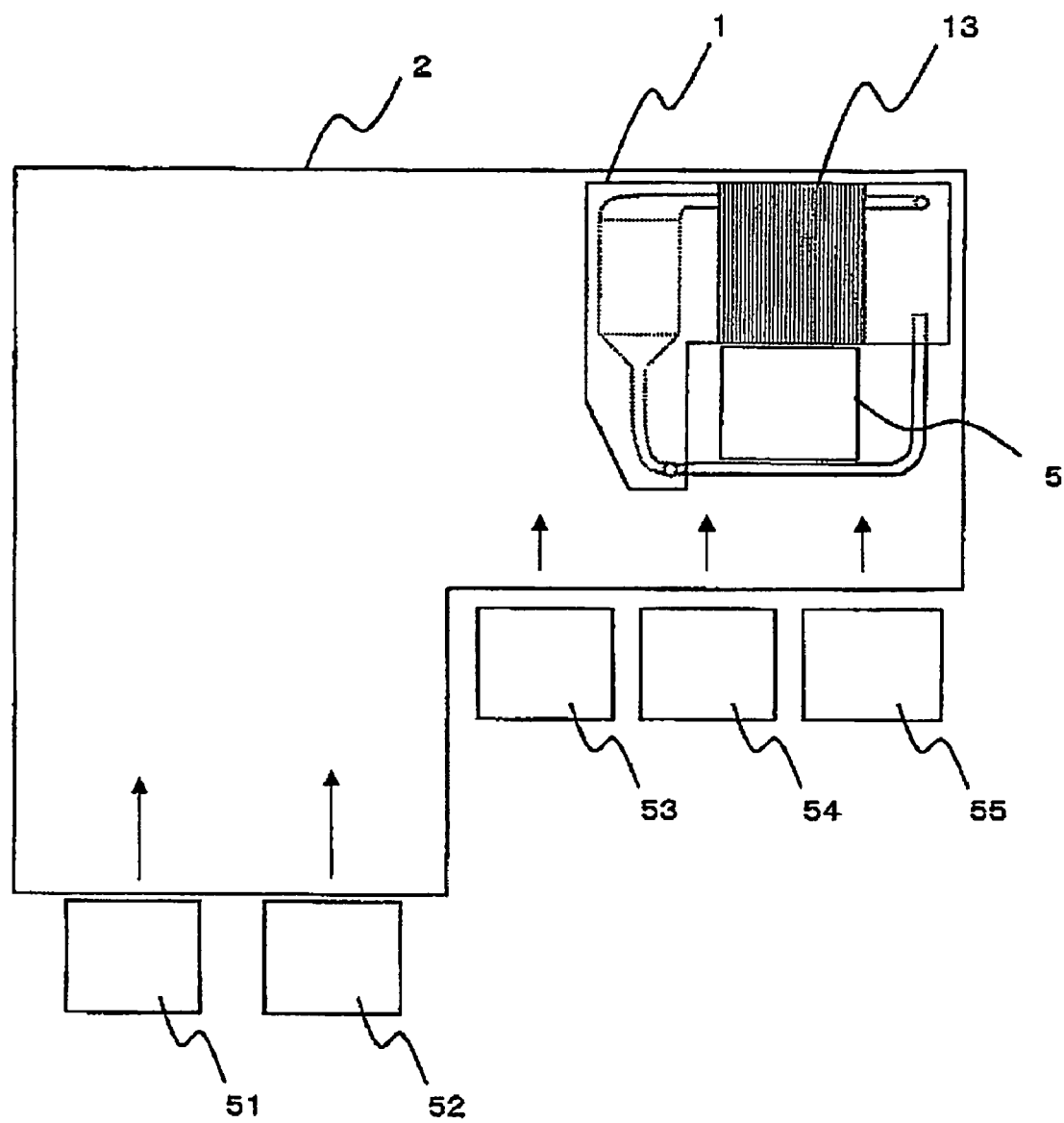
FIG. 24 A top plan view showing an example of experiment for the cooling effect depending on the change of air-flow on the bottom surface of the second cooling panel shown in FIG. 1.
Figure 25:
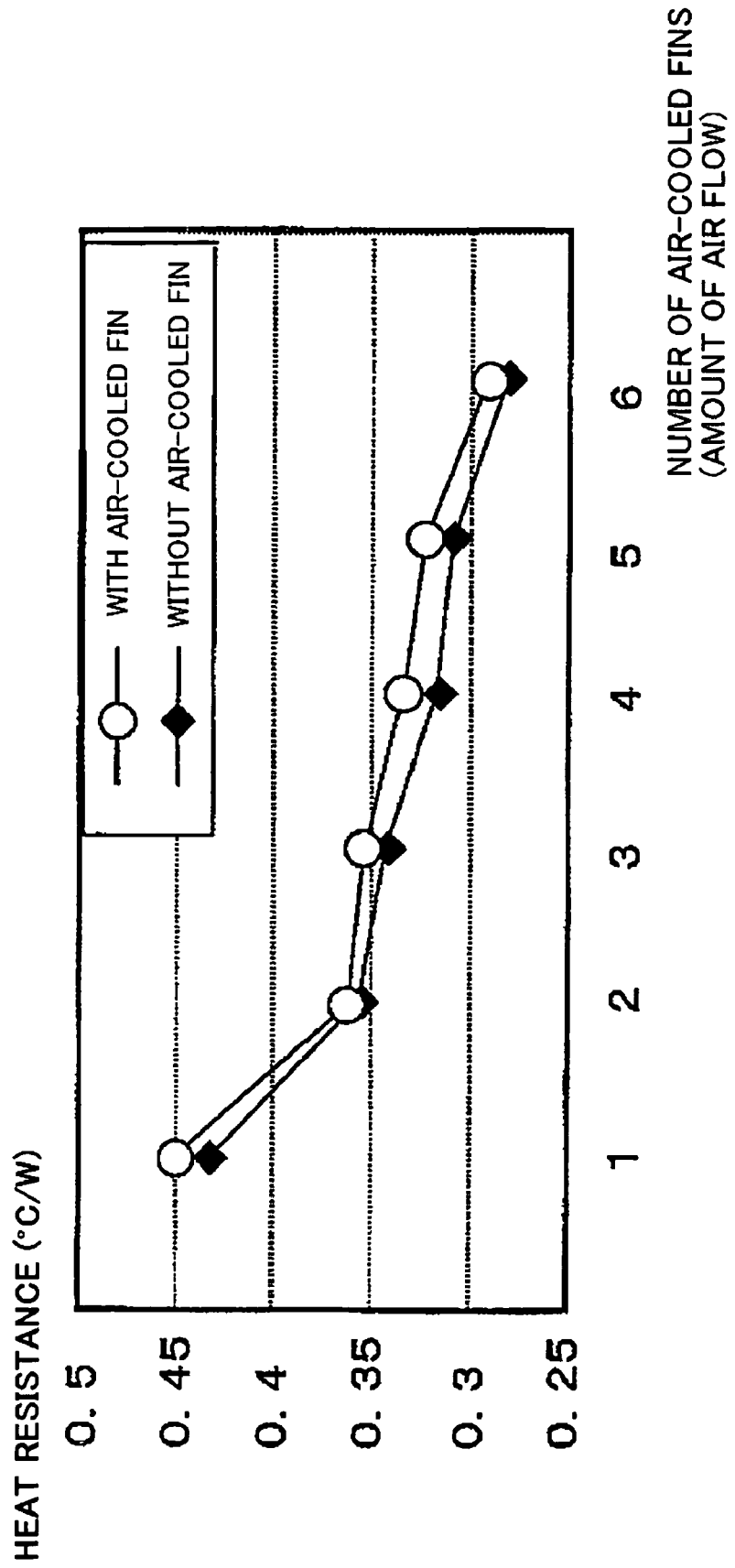
FIG. 25 A graph showing the relationship between the change of air-flow on the bottom surface of the second cooling panel shown in FIG. 1 and the cooling effect.

FIG. 21 illustrates a first example of assembly into the electronic equipment, wherein (a) is a perspective view thereof and (b) is a sectional view taken along line Z-Z' shown in (a). FIG. 22 illustrates a second example of assembly into the electronic equipment, wherein (a) is a perspective view thereof and (b) is a sectional view taken along line Z-Z' shown in (a). FIG. 23 illustrates a third example of assembly into the electronic equipment, wherein (a) is a perspective view thereof and (b) is a sectional view taken along line Z-Z' shown in (a). FIG. 24 illustrates an example of the test for assuring the cooling effect during the change in the amount of air flow on the bottom surface of the second cooling panel shown in FIG. 1. FIG. 25 shows the relationship between the change in the amount of air flow on the bottom surface of the second cooling panel shown in FIG. 1 and the cooling effect.

Referring to FIG. 21, in the first assembly example, the housing 80 of a notebook personal computer having a typical thickness of around 3-4 cm is provided therein with main electric components having relatively large sizes and different thicknesses, such as DVD-RAM 81, FD-RAM 82, HDD 83, battery 84 and memory card 85, and a mother board 86 on which a heating part 7 such as CPU is provided. The second cooling panel 2 is mounted to underlie the mother board 86. In the first assembly example, it is assumed that the micro-channel structure 12 is formed in the second cooling panel 2, and the heating part 7 mounted on the top surface of the mother board 86 is in contact with the top surface of the second cooling panel 2 in the area in which the micro-channel structure 12 is formed.

The second assembly example has a higher cooling efficiency over the first assembly example. Referring to FIG. 22, the first cooling panel 1 is mounted overlying the mother board 86 on which the heating part 7 such as CPU is mounted, and the second cooling panel 2 is mounted underlying the mother board 86. The heating part 7 mounted on the top surface of the mother board 86 is in contact with the bottom surface of the first cooling panel 1 in the area in which the micro-channel structure 12 is formed. The first cooling panel 1 can be opened and closed, as described before. In the second assembly example, the opening movement of the first cooling panel 1 allows an easy maintenance such as replacement of the heating part 7 mounted on the top surface of the mother board 86.

The third assembly example has a higher cooling efficiency over the second assembly example. Referring to FIG. 23, the first cooling panel 1 is mounted overlying the mother board 86 on which the heating part 7 such as CPU is mounted, and the second cooling panel 2 is mounted underlying the mother board 86. The heating part 7 mounted on the top surface of the mother board 86 is in contact with the bottom surface of the first cooling panel 1 in the area in which the micro-channel structure 12 is formed. The first cooling panel 1 is provided with an air-cooled fin 13. There are provided a fan 5 which supplies an air flow onto the air-cooled fin 13 formed on the first cooling panel 1, and a fan 51 which forms an air flow on the bottom surface of the second cooling panel 2.

For verification of the relationship between the amount of air flow supplied on the bottom surface of the second cooling panel 2 and the cooling effect in the third assembly example, as shown in FIG. 24, fans 51 to 55 for forming the air flow on the bottom surface of the second cooling panel 2 were arranged, wherein the heat resistance was measured while changing the number of fans 51 to 55. The fan 5 which provided the air flow to the air-cooled fin 13 formed on the first cooling panel 1 was operated at any time during the measurement. The results are such that, as shown in FIG. 25, a larger number of fans 51 to 55 provided a reduced heat resistance, to thereby prove the improvement in the cooling effect.

The heat resistance was also measured while changing the number of fans 51 to 55, for another example wherein the air-cooled fin is formed on the bottom surface of the second cooling panel 2. The results are such that, as shown in FIG. 25, there was substantially no difference in the cooling effect between the case where the air-cooled fin was formed on the bottom of the second cooling panel 2 and the other case where there was no air-cooled fin.

As described above, the first embodiment is configured such that the second cooling panel 2, wherein the passage 21 is formed by covering the groove 213 formed on the bottom heat radiation plate 23 with the top radiation plate 24, is mounted on the bottom of the electronic equipment. This assures a sufficient heat radiation area to thereby improve the cooling efficiency, and provides a smaller thickness for the cooling device. Even the smaller thickness of the cooling device results in effective prevention of the leakage of the refrigerant.

In addition, the first embodiment employs the configuration wherein the struts for reinforcing the bonding between the bottom heat radiation plate 23 and the top heat radiation plate 24 are formed in the passage 21 of the second cooling panel 2 mounted on the bottom of the electronic equipment. This allows a larger width for the passage 21 of the second cooling panel 2 and a smaller thickness for the bottom heat radiation plate 23 and top heat radiation plate 24, thereby assuring a sufficient heat radiation area to improve the cooling efficiency and allowing a smaller thickness for the cooling device.

Moreover, the configuration wherein the circulation pump 3 is fixed onto the top surface of the second cooling panel 2 mounted on the bottom of the electronic equipment in the first embodiment provides an effective prevention of the leakage of the refrigerant.

Moreover, the configuration, wherein the branch hole is provided which branches upward from the passage 21 of the second cooling panel 2 mounted on the bottom of the electronic equipment in the first embodiment and wherein the reservoir 4 is provided overlying the branch hole, allows the air bubbles generated due to the temperature change within the electronic equipment or the pressure change in the passage to be trapped in the reservoir 4. This allows prevention of reduction in the amount of outlet flow from the circulation pump 3 caused by mixing of air bubbles.

Moreover, the configuration, wherein the branch hole is provided which branches upward from the passage 21 of the second cooling panel 2 mounted on the bottom of the electronic equipment in the first embodiment and wherein the reservoir 4 is provided overlying the branch hole, allows the air 45 in the reservoir 4 to alleviate the pressure change in the passage caused by the temperature change within the electronic equipment. This allows prevention of damage due to the stress generating locally due to the pressure change in the passage.

Moreover, the first embodiment is such that the metallic material having a superior heat conductivity is used for the bottom heat radiation plate 23 and top heat radiation plate 24 of the second cooling panel 2 configuring the passage 21 through which the refrigerant circulates and that the top heat radiation plate 24 and the circulation pump 3 are coupled together by a metallic bonding technique. This provides an integral body for the circulation pump 3 and the passage 11, and allows the entirety of the passage 11 to be covered with the metallic material, thereby achieving the advantage of occurring of no evaporation or leakage of the refrigerant. It is to be noted that the structure (third configuration example) wherein the circulation pump 3 is coupled to the top heat radiation plate 24 of the second cooling panel 2 via the O-ring 332 may incur the possibility of occurring of evaporation or leakage of the refrigerant through the coupling by the O-ring 332 because of the separate structure of the circulation pump 3. However, this case allows an easy maintenance.

As described above, in the cooling device for an electronic equipment according to the first embodiment of the present invention, the second cooling panel, wherein the groove formed on the bottom heat radiation plate of the second cooling panel is covered with the top heat radiation plate of the second cooling panel, is mounted on the bottom of the electronic equipment. This configuration assures a sufficient cooling area to thereby improve the cooling efficiency, reduces the thickness of the cooling device, and prevents leakage of the refrigerant as much as possible even in this small thickness of the cooling device.

Moreover, in the cooling device for an electronic equipment according to the first embodiment of the present invention, struts for reinforcing the bonding between the bottom heat radiation plate and the top heat radiation plate are formed in the passage of the second cooling panel mounted on the bottom of the electronic equipment. This configuration provides a larger width for the passage of the second cooling panel, and reduces the thickness of the bottom heat radiation plate and top heat radiation plate of the second cooling panel. This assures a sufficient heat radiation area to thereby improve the radiation efficiency, and reduces the thickness of the cooling device.

Moreover, in the cooling device for an electronic equipment according to the first embodiment of the present invention, the configuration, wherein the circulation pump is fixed onto the top surface of the second cooling panel mounted on the bottom of the electronic equipment, effectively prevents leakage of the refrigerant.

Moreover, in the cooling device for an electronic equipment according to the first embodiment of the present invention, the branch hole is provided which branches upward from the passage of the second cooling panel mounted on the bottom of the electronic equipment, and the reservoir is located overlying the branch hole. This allows the air bubbles generated due to the temperature change within the electronic equipment or the pressure change in the passage to be trapped in the reservoir, thereby effectively preventing the reduction in the amount of outlet flow from the circulation pump due to the mixing of the air bubbles.

Moreover, in the cooling device for an electronic equipment according to the first embodiment of the present invention, the branch hole is provided which branches upward from the passage of the second cooling panel mounted on the bottom of the electronic equipment, and the reservoir is located overlying the branch hole. This allows the air in the reservoir to alleviate the pressure change in the passage caused by the temperature change in the electronic equipment, thereby effectively preventing the damage caused by the stress occurring locally due to the pressure change in the passage.

Moreover, in the cooling device for an electronic equipment according to the first embodiment of the present invention, the metallic material having a superior heat conductivity is employed for the bottom heat radiation plate and top heat radiation plate of the second cooling panel configuring the passage through which the refrigerant circulates, and the top heat radiation plate of the second cooling panel and the circulation pump are coupled together by using a metallic bonding technique. This provides an integral body for the circulation pump and the passage, and allows the entirety of the passage to be covered with the metallic material, thereby achieving the advantage of occurring of no evaporation or leakage of the refrigerant. It is to be noted that the structure wherein the circulation pump 3 is coupled to the top heat radiation plate of the second cooling panel via the O-ring may incur the possibility of occurring of evaporation or leakage of the refrigerant because of the separate structure of the circulation pump 3.

Figure 26:
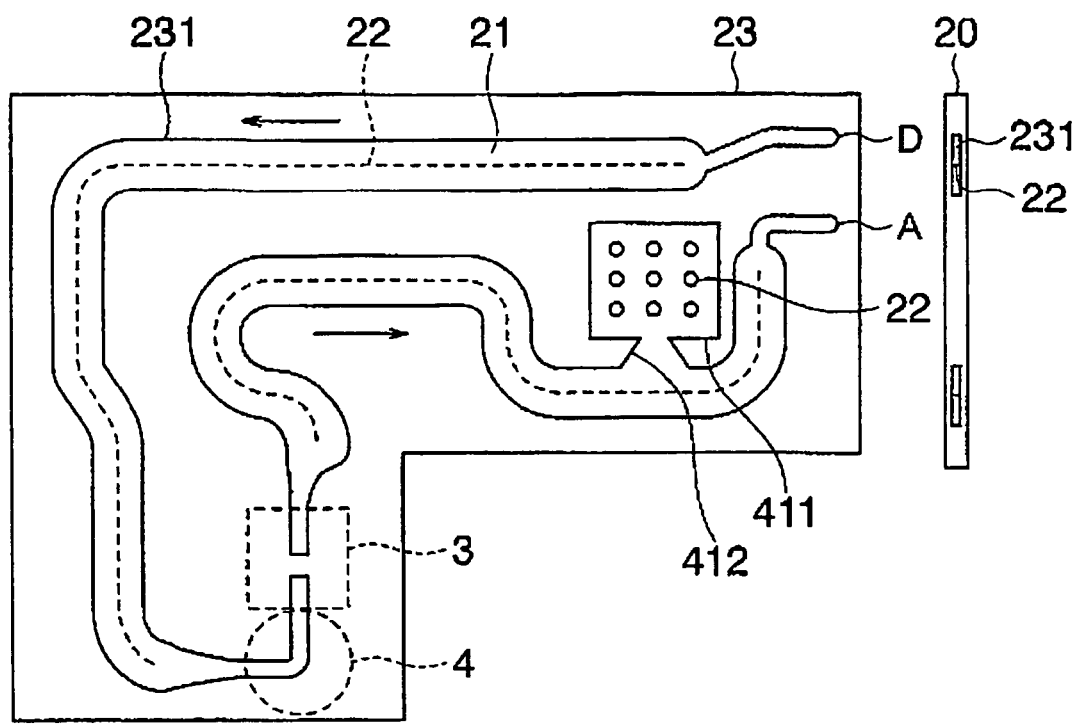
FIG. 26 A top plan view of the second cooling panel in a cooling device for an electronic equipment according to a second embodiment of the present invention.

Next, a cooling device for an electronic equipment according to a second embodiment of the present invention will be described. With reference to FIG. 26 first, the simple structure of a standing-rest-type reservoir 411 will be described. In the cooling device shown in the same drawing, the cooling panel (substrate) 20 has an integral body and includes therein a groove 231 configuring the passage (21). In addition, the passage 21 extending in a two-dimensional plane is provided with a laid-down-type reservoir 4 and the standing-rest-type reservoir 411 along the passage. Thus, the present cooling device can be used in a standing posture, for example, with the top side shown in FIG. 26 being the upside in the vertical direction and the bottom side shown in FIG. 26 being the downside in the vertical direction. The standing-rest-type reservoir 411 plays the roll for alleviating the pressure change in the passage against the expansion or compression caused by the temperature change of the refrigerant, and for trapping the air bubbles in the passage 11.

On the other hand, if the device is used in the state where the shape of FIG. 26 is a vertical view, i.e., the present cooling device is used as laid down on a desk, the laid-down-type reservoir 4 plays the roll similar to that of the standing-rest-type reservoir 411. As described above, provision of both the reservoirs 4 and 411 allows the pressure change caused by expansion or compression due to the temperature change of the refrigerant in the passage to be alleviated in the case where the electronic equipment body such as a notebook PC is used on a desk or used while being hanged on the wall, contributing improvement in the withstand-pressure performance of the present cooling device by trapping the air bubbles in the passage 21.

Figure 27:
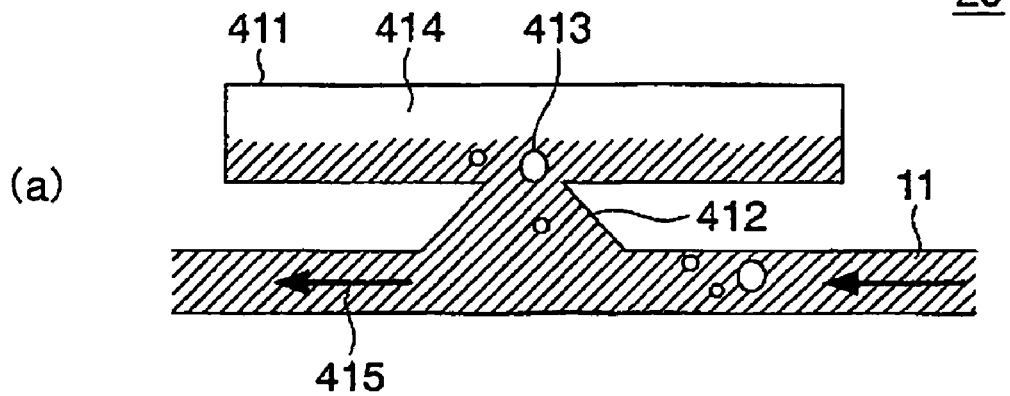
FIG. 27(a) to (c) are top plan views showing the structure of the standing-rest-type reservoir used in the second embodiment.
Figure 27:
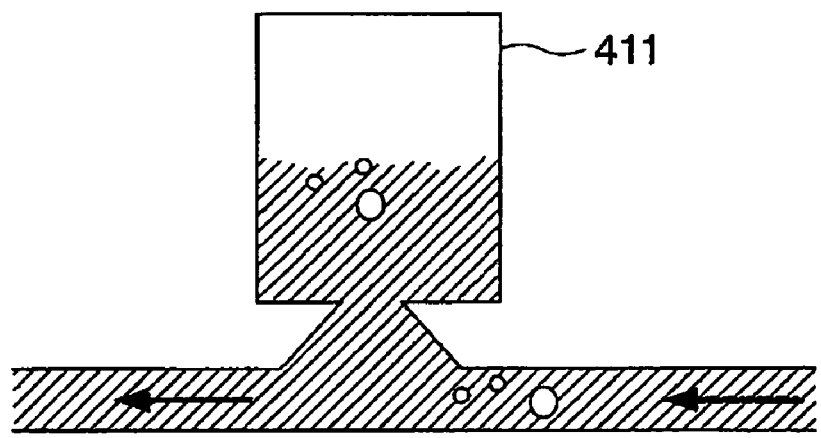
Figure 27:
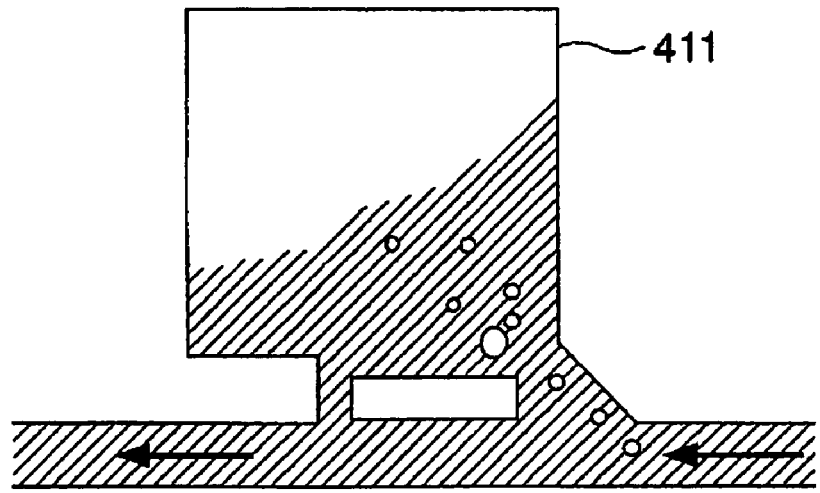

With reference to FIG. 27, the concrete configuration of the standing-rest-type reservoir 411 will be described. FIG. 27 (*a*) to (*c*) show enlarged standing-rest-type reservoir 411 shown in FIG. 1, wherein the electronic equipment body such as notebook PC is used in a standing posture. In other words, this figure is depicted in the state wherein the user observes from the front thereof.

When the air bubbles 413 generated as by the temperature change and included in the refrigerant 415 circulated by the circulation pump 3 within the passage 11 reach the vicinity of the standing-rest-type reservoir 411, the air bubbles 413 are introduced into the standing-rest-type reservoir 411 along the wall surface of the taper portion 412 due to a lower specific density thereof compared to the liquid. After staying in the upper portion of the reservoir, the air bubbles 413 are eventually trapped in the air layer 414.

As the configuration for allowing the air bubbles 413 introduced within the standing-rest-type reservoir 411 not to return to the passage 11, the inlet portion of the standing-rest-type reservoir 411 is provided with a trapezoid taper 412, wherein the inside of the standing-rest-type reservoir 411 is either wide in the lateral direction or longer in the vertical direction to have an internal volume at least comparable to or larger than that of the laid-down-type reservoir 4.

Due to the configuration as described above, the air bubbles 413 do not return from the standing-rest-type reservoir 411 to the liquid in the passage 11 so long as the configuration wherein the air bubbles 413 have the specific density lower than that of the liquid satisfies. This fact was assured by the present inventors using experiments. Moreover, according to an example of the present invention, it was confirmed that the configuration wherein the standing-rest-type reservoir 411 had a volume comparable to or larger than the volume of the laid-down-type reservoir 4, or an optimization of the amount of the air layer 414 within the reservoir alleviated the pressure change in the passage caused by the expansion or compression of the refrigerant due to the temperature change thereof.

Next, the shape of the standing-rest-type reservoir 411 will be described. The reservoirs 411 shown in FIGS. 27(*a*) to 27(*c*) each play a roll for trapping the air bubbles 413 and alleviating the pressure. However, if the location for mounting the heating part, such as CPU, circulation pump 3 and laid-down-type reservoir 4 is changed, the optimum design for the passage 11 suffers from a variety of restrictions therefrom. In accordance with the examples, the shapes of the standing-rest-type reservoirs 411 shown in FIGS. 27(*a*) to 27(*c*) are selected depending on the layout of the large electronic parts in the electronic equipment including heating part on the mother board, such as CPU, or HDD and DVD, thereby effectively achieving the improvement in the cooling performance and smaller thickness.

The standing-rest-type reservoir 411 shown in FIG. 27(*a*) is a laterally elongate type, wherein it is wide in the lateral direction and short in the longitudinal direction, whereby it allows a smallest spacing between the passage 11 and another passage adjacent thereto in the vertical direction, while assuring the function of the reservoir. The standing-rest-type reservoir 411 shown in FIG. 27(*b*) is a longitudinally elongate type, whereby it allows a smallest spacing between horizontally adjacent passages 11. Thus, by taking advantage of the spacing between vertically adjacent passages 11, a larger volume can be assured to thereby further alleviate the pressure change.

In the standing-rest-type reservoir 411 shown in FIG. 27(*c*), a portion of the standing-rest-type reservoir 411 is coupled to the passage 11. This allows the reservoir to trap the air bubbles in a larger amount compared to the reservoirs shown in FIGS. 27(*a*) and (*b*), if the flow rate of the refrigerant flowing through the passage 11 increases. In such a case, the reservoir is not filled with liquid in its full space, thereby allowing a specific amount of air layer 414 to be assured and secure trapping of the air bubbles 413.

In either structure of the standing-rest-type reservoir in the second embodiment, the air bubbles 413 occurring in the passage can be effectively trapped. Thus, the standing-rest-type reservoir 411 having an air storage function can be extended two-dimensionally for the liquid circulation path in the present cooling device, and can be embedded together with the passage between the top heat radiation panel and the bottom heat radiation panel of the first cooling panel made of a metallic material such as aluminum and copper having a superior heat conductivity. This reduces the total thickness of the plate of the cooling member down to 2 mm or smaller. It is apparent that a plurality of the same type or different types of the standing-rest-type reservoir 411 and laid-down-type reservoir 4 can be provided instead of a single one, to achieve a superior advantage.

Figure 28:
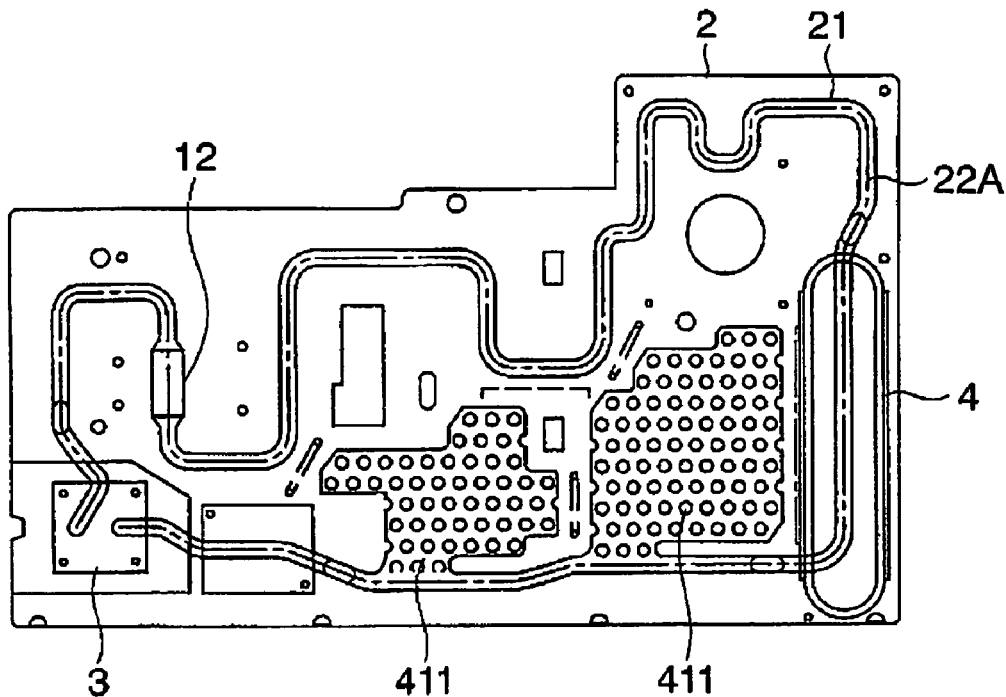
FIG. 28(a) is a top plan view of the second cooling panel in a cooling device for an electronic equipment according to a third embodiment of the present invention, (b) is a side view of the cooling panel, and (c) is a detailed sectional view of a part of the cooling panel.
Figure 28:
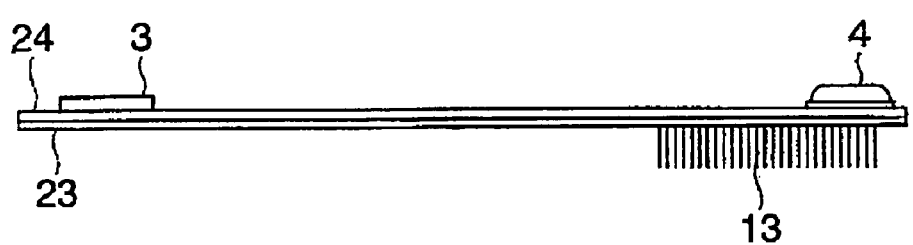
Figure 28:
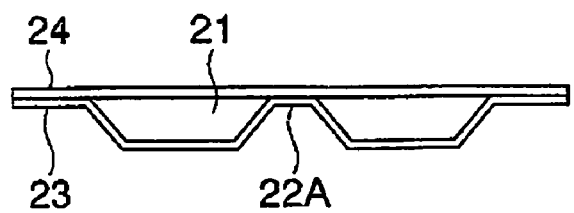

FIG. 28(*a*) shows a second cooling panel in a third embodiment of the present invention. In this embodiment, the cooling device includes only a single cooling panel 2, and a piezoelectric pump 3 is supported on the top heat radiation plate of the cooling panel 2. The cooling panel 2 is provided with a passage 21 wherein struts 22 are formed in the central position, and the passage 21 is wobbled. The passage 21 is provided with the standing-rest-type reservoir 411 inserted and formed within the cooling panel 2, and the laid-down-type reservoir 4 located on the top heat radiation plate.

FIG. 28(*b*) is a side view of the cooling device of the present embodiment. The cooling panel 2 is formed by bonding together the bottom heat radiation plate 23 and the top heat radiation plate 24. Onto the top heat radiation plate 24 of the cooling panel are fixed the piezoelectric pump 3 and laid-down-type reservoir 4, whereas onto the bottom heat radiation plate 23 is fixed the air-cooled fin 13. Although not shown therein, a micro-channel structure may be formed in the passage 21, and in such a case, guide plates are arranged between the passage and the micro-channel structure.

FIG. 28(c) shows the structure of the passage in the cooling panel. In this embodiment, the groove for the passage is formed by shaping the bottom heat radiation plate 23. A reinforcement structure 22A is formed in the central position of the passage instead of the struts.

It will be apparent that the present invention is not limited to the above embodiments and that the embodiments may be modified as desired within the scope of the technical concept of the present invention. For example, the number, location, shape etc. of the above constituent members are not limited to the above embodiments and may be selected as suitable number, location and shape for implementation of the present invention.

The invention claimed is:

1. A cooling device for an electronic equipment, comprising:
 a cooling panel including a bottom heat radiation plate and a top heat radiation plate, at least one of which is provided with a groove, said bottom heat radiation plate and top heat radiation plate being bonded together to form a passage of refrigerant; and
 a circulation pump fixed onto said cooling panel to circulate said refrigerant through said passage for radiating heat transferred to said cooling panel, wherein:
 said top heat radiation plate is provide with an inlet port through which said refrigerant flows from said passage to said circulation pump and an outlet port through which said refrigerant flows from said circulation pump to said passage; and
 said circulation pump is fixed onto said inlet port and outlet port;
 wherein said circulation pump is a piezoelectric pump, and
 wherein said piezoelectric pump includes a pump housing defining a pump chamber receiving therein a piezoelectric vibration plate, and said pump housing is fixed onto said cooling panel so that a discharge port and a suction port of said circulation pump are aligned with said inlet port and said outlet port, respectively.

2. The cooling device for an electronic equipment according to claim 1, wherein a check valve is provided in operative relationship with each of said discharge port and said suction port, and said check valve is fixed onto a member which is detachably attached onto said pump housing.

3. The cooling device for an electronic equipment according to claim 1, wherein said piezoelectric vibration plate has a bimorph structure including an elastic circular plate and a pair of piezoelectric ceramic circular plates sandwiching therebetween said elastic circular plate and polarized in opposite directions to each another, each of said pair of piezoelectric ceramic circular plates has a layered structure including a plurality of ceramic layers, and adjacent two of said ceramic layers in said layered structure are polarized in opposite directions to each other.

4. The cooling device for an electronic equipment according to claim 1, wherein a reinforcement is formed in said groove for reinforcing bonding of said bottom heat radiation plate and said bottom heat radiation plate.

5. The cooling device for an electronic equipment according to claim 1, further comprising a reservoir communicated with a branch hole and fixed onto said top heat radiation plate of said cooling panel and formed in said passage.

6. The cooling device for an electronic equipment according to claim 5, wherein a taper of a circular truncated cone or truncated pyramid having an apex at an exit of said branch hole is formed on a bottom surface of said reservoir.

7. The cooling device for an electronic equipment according to claim 6, wherein a volume of said reservoir below said apex of said taper is larger than a volume of said reservoir above said apex of said taper (41), and said refrigerant fills said reservoir so that a liquid level is located above said apex of said taper.

8. The cooling device for an electronic equipment according to claim 6, wherein a protrusion having an area smaller than a cross-sectional area of said branch hole is formed on top of said reservoir at a position opposing said branch hole.

9. The cooling device for an electronic equipment according to claim 1, wherein a portion of said passage is replaced by a micro-channel structure including a plurality of narrow grooves having a width smaller than a width of said groove.

10. The cooling device for an electronic equipment according to claim 9, wherein a guide plate is formed between said passage and said micro-channel structure for enlarging flow of said refrigerant from a width of said passage up to a width of said micro-channel structure.

11. The cooling device for an electronic equipment according to claim 10, wherein said guide plate includes a plurality of guide plates, and wherein one of said guide plates is longer than another of said guide plates located at downstream of said one of said guide plates, and has a larger angle with respect to a flow direction of said refrigerant than said another.

12. The cooling device for an electronic equipment according to claim 1, wherein said passage is coated with metal.

13. A cooling device for an electronic equipment comprising:
 a cooling panel including a bottom heat radiation plate and a top heat radiation plate, at least one of which is provided with a groove, said bottom heat radiation plate and top heat radiation plate being bonded together to form a passage of refrigerant; and
 a circulation pump fixed onto said cooling panel to circulate said refrigerant through said passage for radiating heat transferred to said cooling panel, wherein:
 said top heat radiation plate is provide with an inlet port through which said refrigerant flows from said passage to said circulation pump and an outlet port through which said refrigerant flows from said circulation pump to said passage; and
 said circulation pump is fixed onto said inlet port and outlet port;
 wherein said piezoelectric vibration plate includes a pair of first piezoelectric ceramic elements not polarized, a pair of second piezoelectric ceramic elements sandwiching therebetween said first piezoelectric ceramic elements and polarized in opposite directions to each other, and a pair of third piezoelectric ceramic elements disposed outside said second piezoelectric ceramic elements and not polarized, and wherein each of said second piezoelectric ceramic elements has a layered structure including a plurality of ceramic layers, adjacent two of said ceramic layers in said layered structure are polarized in opposite direction to each other, and said first through third piezoelectric ceramic elements are sintered to form an integral structure.

14. A cooling device for an electronic equipment, comprising a substrate, a passage embedded in said substrate and passing therethrough refrigerant, a circulation pump disposed on a surface of said substrate, and a reservoir communicated with said first passage via a branch hole, wherein said circulation pump circulates said refrigerant through said passage to radiate heat transferred to said substrate, wherein said circulation pump is a piezoelectric pump, and wherein said piezoelectric pump includes a pump housing defining a pump chamber receiving therein a piezoelectric vibration plate, and said pump housing is fixed onto said substrate so that a discharge port and a suction port of said circulation pump are aligned with said passage, respectively.

15. The cooling device for electronic equipment according to claim 14, wherein said reservoir is a laid-down-type reservoir fixed onto said surface of said substrate.

16. A cooling device for an electronic equipment comprising a substrate, a passage embedded in said substrate and passing therethrough refrigerant, a circulation pump disposed on a surface of said substrate, and a reservoir communicated with said first passage via a branch hole, wherein said circulation pump circulates said refrigerant through said passage to radiate heat transferred to said substrate, wherein said reservoir is a standing-rest-type reservoir installed within said substrate, wherein said circulation pump is a piezoelectric pump, and wherein said piezoelectric pump includes a pump housing defining a pump chamber receiving therein a piezoelectric vibration plate, and said pump housing is fixed onto said substrate so that a discharge port and a suction port of said circulation pump are aligned with said passage, respectively.

17. An electronic equipment having mounting thereon a cooling device for an electronic equipment, the cooling device comprising:

a cooling panel including a bottom heat radiation plate and a top heat radiation plate, at least one of which is provided with a groove, said bottom heat radiation plate and top heat radiation plate being bonded together to form a passage of refrigerant; and a circulation pump fixed onto said cooling panel to circulate said refrigerant through said passage for radiating heat transferred to said cooling panel, wherein:

said top heat radiation plate is provide with an inlet port through which said refrigerant flows from said passage to said circulation pump and an outlet port through which said refrigerant flows from said circulation pump to said passage; and said circulation pump is fixed onto said inlet port and outlet port, wherein said circulation pump is a piezoelectric pump, and wherein said piezoelectric pump includes a pump housing defining a pump chamber receiving therein a piezoelectric vibration plate, and said pump housing is fixed onto said cooling panel so that a discharge port and a suction port of said circulation pump are aligned with said inlet port and said outlet port, respectively.

* * * * *